(12) United States Patent
Tsai et al.

(10) Patent No.: US 12,021,045 B2
(45) Date of Patent: Jun. 25, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Po-Hao Tsai, Zhongli (TW); Po-Yao Chuang, Hsinchu (TW); Ming-Chih Yew, Hsinchu (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/186,348

(22) Filed: Mar. 20, 2023

(65) Prior Publication Data

US 2023/0223364 A1    Jul. 13, 2023

Related U.S. Application Data

(63) Continuation of application No. 17/222,044, filed on Apr. 5, 2021, now Pat. No. 11,610,854, which is a
(Continued)

(51) Int. Cl.
    *H01L 23/66* (2006.01)
    *H01L 21/56* (2006.01)
(Continued)

(52) U.S. Cl.
    CPC ............ *H01L 23/66* (2013.01); *H01L 21/566* (2013.01); *H01L 23/3107* (2013.01);
(Continued)

(58) Field of Classification Search
    CPC ....... H01L 23/66; H01L 21/566; H01L 24/09; H01L 23/481; H01L 23/3107;
(Continued)

(56) References Cited

U.S. PATENT DOCUMENTS 10,763,225 B2 *  9/2020  Kim ........................ H01L 24/82
2006/0099738 A1  5/2006  Yamazaki
(Continued)

FOREIGN PATENT DOCUMENTS

| CN | 101194360 A | 6/2008 |
| CN | 101728327 A | 6/2010 |

(Continued)

*Primary Examiner* — Karen Kusumakar
(74) *Attorney, Agent, or Firm* — Slater Matsil, LLP

(57) ABSTRACT

A device includes a redistribution structure, a first semiconductor device, a first antenna, and a first conductive pillar on the redistribution structure that are electrically connected to the redistribution structure, an antenna structure over the first semiconductor device, wherein the antenna structure includes a second antenna that is different from the first antenna, wherein the antenna structure includes an external connection bonded to the first conductive pillar, and a molding material extending between the antenna structure and the redistribution structure, the molding material surrounding the first semiconductor device, the first antenna, the external connection, and the first conductive pillar.

20 Claims, 33 Drawing Sheets

Related U.S. Application Data continuation of application No. 16/530,276, filed on Aug. 2, 2019, now Pat. No. 10,971,461.

(60) Provisional application No. 62/718,996, filed on Aug. 16, 2018.

(51) Int. Cl.

| | | |
|---|---|---|
| *H01L 23/00* | (2006.01) | |
| *H01L 23/31* | (2006.01) | |
| *H01L 23/48* | (2006.01) | |
| *H01L 23/498* | (2006.01) | |
| *H01L 23/538* | (2006.01) | |
| *H01Q 1/22* | (2006.01) | |
| *H01Q 9/04* | (2006.01) | |
| *H01Q 9/28* | (2006.01) | |
| *H01Q 21/06* | (2006.01) | |

(52) U.S. Cl.
CPC ...... *H01L 23/481* (2013.01); *H01L 23/49822* (2013.01); *H01L 23/5383* (2013.01); *H01L 24/09* (2013.01); *H01L 24/17* (2013.01); *H01Q 1/2283* (2013.01); *H01Q 9/045* (2013.01); *H01Q 9/285* (2013.01); *H01Q 21/062* (2013.01); *H01Q 21/065* (2013.01); *H01L 24/16* (2013.01); *H01L 24/32* (2013.01); *H01L 24/73* (2013.01); *H01L 2223/6677* (2013.01); *H01L 2224/02372* (2013.01); *H01L 2224/02379* (2013.01); *H01L 2224/16227* (2013.01); *H01L 2224/32225* (2013.01); *H01L 2224/73204* (2013.01)

(58) Field of Classification Search
CPC ............. H01L 24/17; H01L 2223/6677; H01L 2224/02372; H01L 2224/02379; H01L 2224/13111; H01L 2224/13139; H01L 2224/29199; H01L 2224/29124; H01L 2224/29184; H01L 2224/29166; H01L 2224/13147; H01L 2224/056; H01L 2224/29155; H01L 2224/2919; H01L 2224/29147; H01L 2224/29339; H01L 24/19; H01L 24/11; H01L 24/05; H01L 2224/11462; H01L 2224/1145; H01L 2224/11334; H01L 2224/11849; H01L 2224/13082; H01L 24/13; H01L 24/16; H01L 24/32; H01L 24/73; H01L 24/92; H01L 2221/68359; H01L 2221/68345; H01L 23/3128; H01L 21/6835; H01L 2924/18161; H01L 23/552; H01L 2924/18162; H01L 2224/04105; H01L 2224/12105; H01L 2224/17181; H01L 2224/17106; H01L 2224/1703; H01L 2224/81192; H01L 2224/81191; H01L 2224/81815; H01L 2224/05666; H01L 2224/05684; H01L 2224/05624; H01L 2224/05647; H01L 2924/3025; H01L 2924/15311; H01L 2924/1533; H01L 2224/73253; H01L 2224/92225; H01L 2224/81005; H01L 2224/83005; H01L 2224/0401; H01L 2224/16227; H01L 2224/32225; H01L 2224/73204; H01L 2224/92125; H01L 25/04; H01L 23/64; H01L 21/4814; H01L 21/50; H01Q 1/2283; H01Q 9/285; H01Q 9/045; H01Q 21/062; H01Q 21/065; H01Q 1/36; H01Q 1/38; H01Q 1/50

See application file for complete search history.

(56) References Cited

U.S. PATENT DOCUMENTS

| | | |
|---|---|---|
| 2009/0168367 A1 | 7/2009 | Fujii |
| 2012/0280366 A1 | 11/2012 | Kamgaing et al. |
| 2016/0172761 A1 | 6/2016 | Garcia et al. |
| 2016/0240492 A1 | 8/2016 | Wolter et al. |
| 2017/0077039 A1 | 3/2017 | Liao et al. |
| 2017/0229769 A1 | 8/2017 | Yokoyama et al. |
| 2017/0236776 A1 | 8/2017 | Huynh et al. |
| 2017/0346185 A1 | 11/2017 | Wang et al. |
| 2019/0189572 A1 | 6/2019 | Chiang et al. |
| 2020/0212536 A1 | 7/2020 | Gupta et al. |

FOREIGN PATENT DOCUMENTS

| | | | |
|---|---|---|---|
| CN | 103915421 | A | 7/2014 |
| CN | 104701304 | A | 6/2015 |
| CN | 106449432 | A | 2/2017 |
| CN | 106972005 | A | 7/2017 |
| CN | 106992160 | A | 7/2017 |
| CN | 107078406 | A | 8/2017 |
| CN | 107437654 | A | 12/2017 |
| CN | 108336494 | A | 7/2018 |
| KR | 20090071386 | A | 7/2009 |
| KR | 20140014260 | A | 2/2014 |
| KR | 20160067961 | A | 6/2016 |
| WO | 2016056387 | A1 | 4/2016 |

* cited by examiner

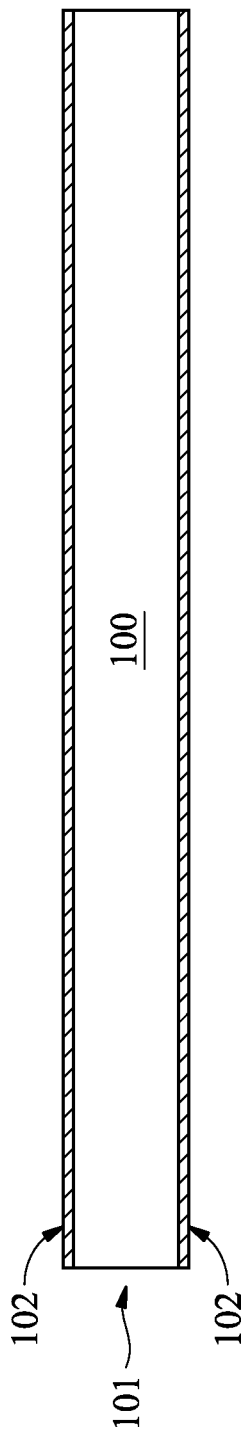
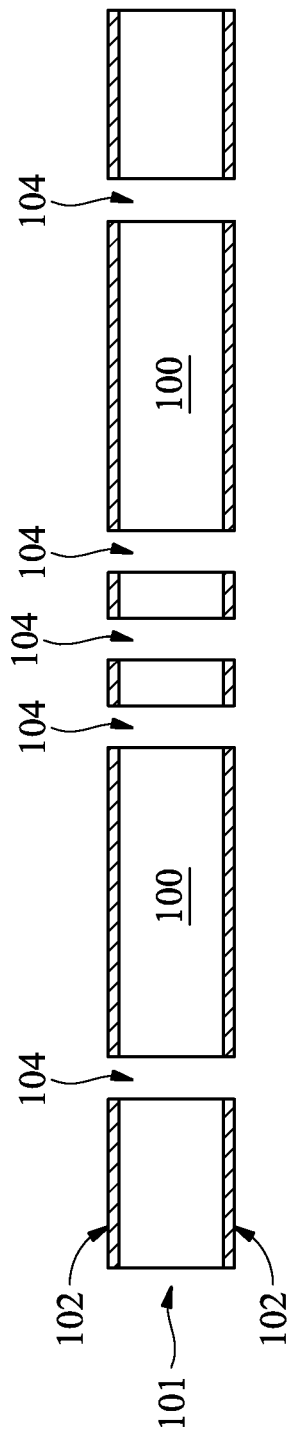

SEMICONDUCTOR DEVICE AND METHOD OF MANUFACTURE

PRIORITY CLAIM AND CROSS-REFERENCE

This application is a continuation of U.S. patent application Ser. No. 17/222,044 entitled "Semiconductor Device and Method of Manufacture," filed on Apr. 5, 2021, which is a continuation of U.S. patent application Ser. No. 16/530,276 entitled "Semiconductor Device and Method of Manufacture," filed on Aug. 2, 2019, now U.S. Pat. No. 10,971,461 issued Apr. 6, 2021, which claims priority to and the benefit of U.S. Provisional Application No. 62/718,996 entitled "Multi-Antenna in Heterogeneous Fan-Out Structure," filed on Aug. 16, 2018, each application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-3A, 3B, 4, 5, 6A, 6B, 7, 8A, 8B, 9A, 9B, 10A, 10B, 10C and 11 illustrate cross-sectional views and plan views of intermediate steps of forming an antenna package, in accordance with some embodiments.

DETAILED DESCRIPTION

Figure 3A:
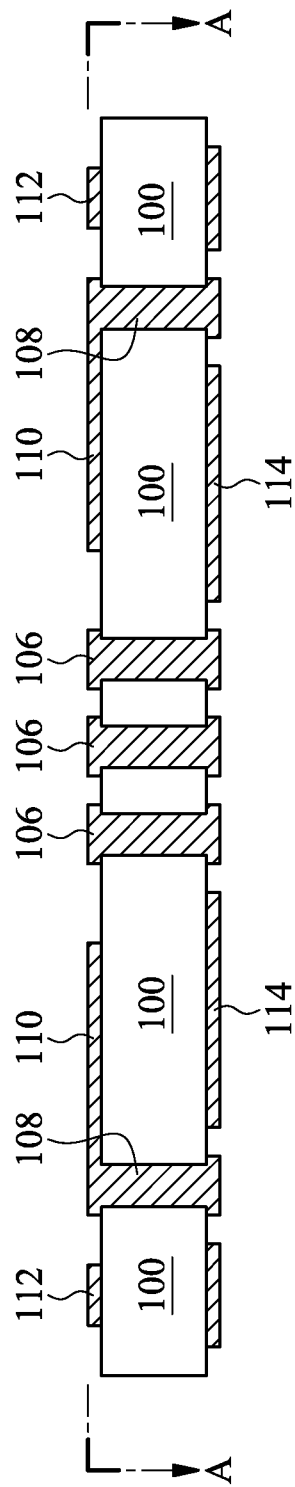

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described below with respect to a particular application utilizing a heterogeneous fan out structure for millimeter wave radio frequency applications. However, the embodiments are not intended to be limited to these embodiments, and the embodiments may be used in a wide variety of applications. The embodiments described herein may allow for multiple types of antennas to be formed in a single package. For example, dipole antennas, end-fire antennas, and patch antennas may all be formed in the same package. By including multiple antenna types, the directionality of the antenna operation of the package may be improved. In some cases, the techniques described herein may allow for reduced size of the package. By forming one or more antennas on a core substrate, the cost of manufacture of the package may be reduced. Some embodiments include thermal vias which may improve heat dissipation within the package.

Figure 9A:
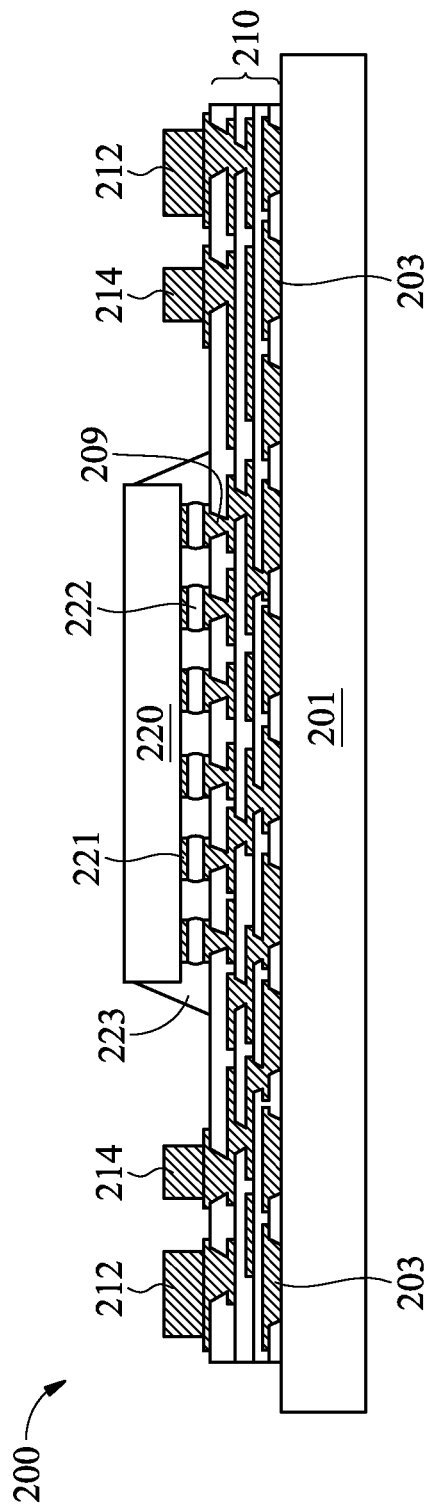
Figure 9B:
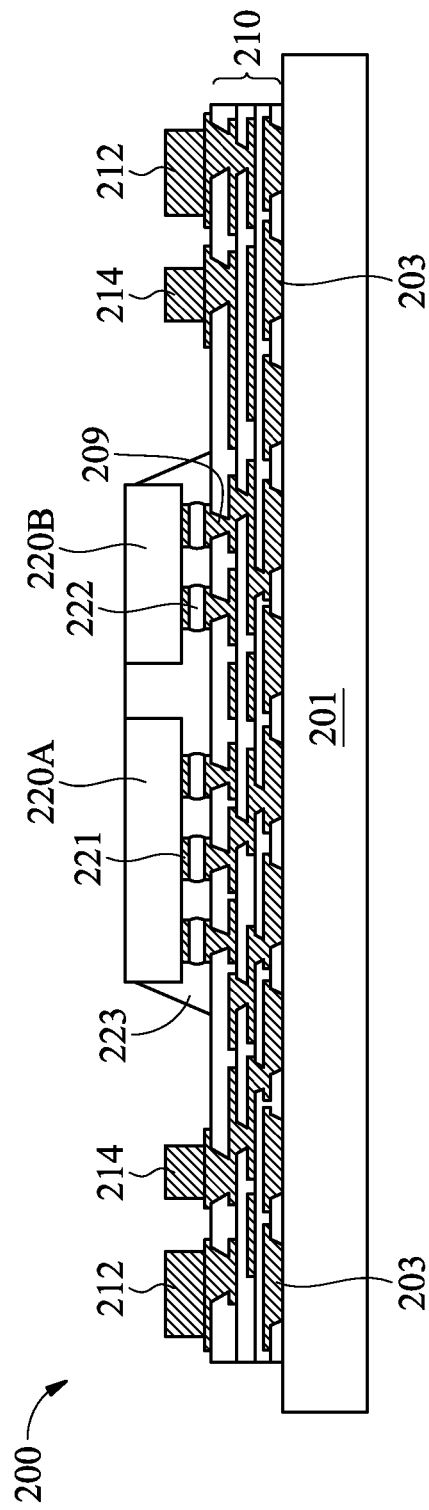
Figure 10A:
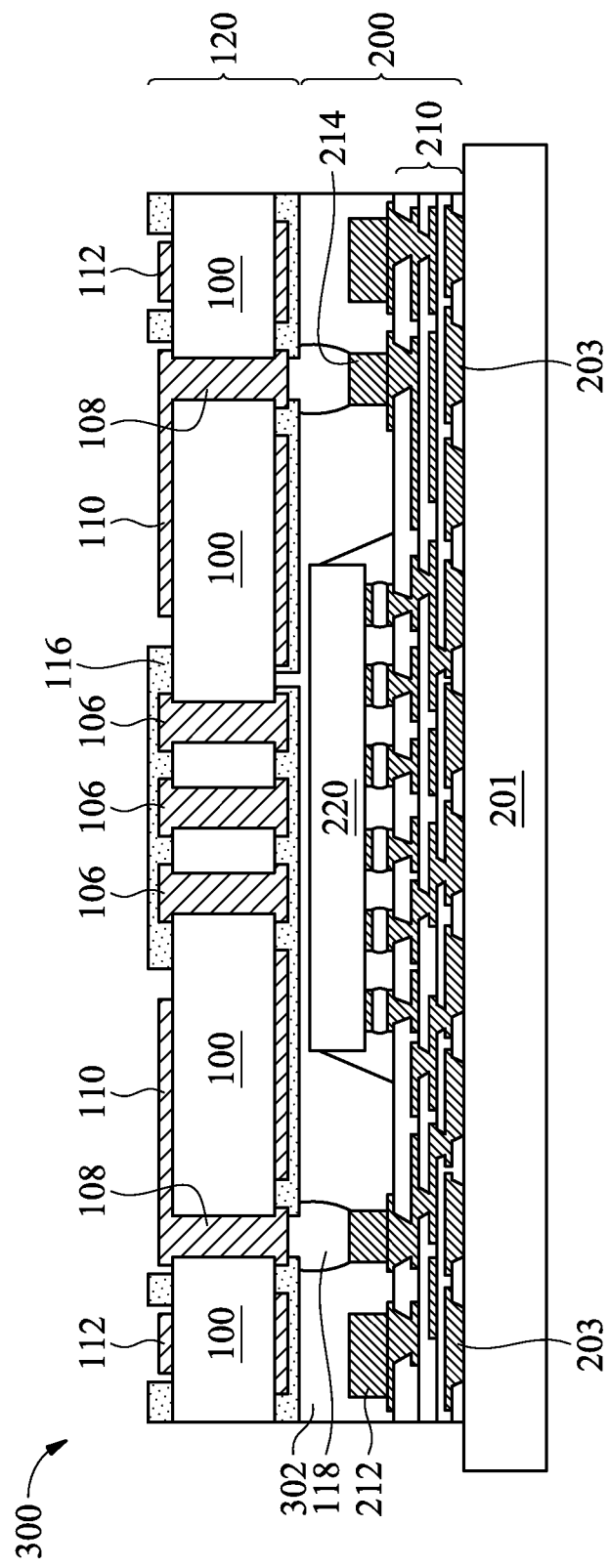
Figure 10B:
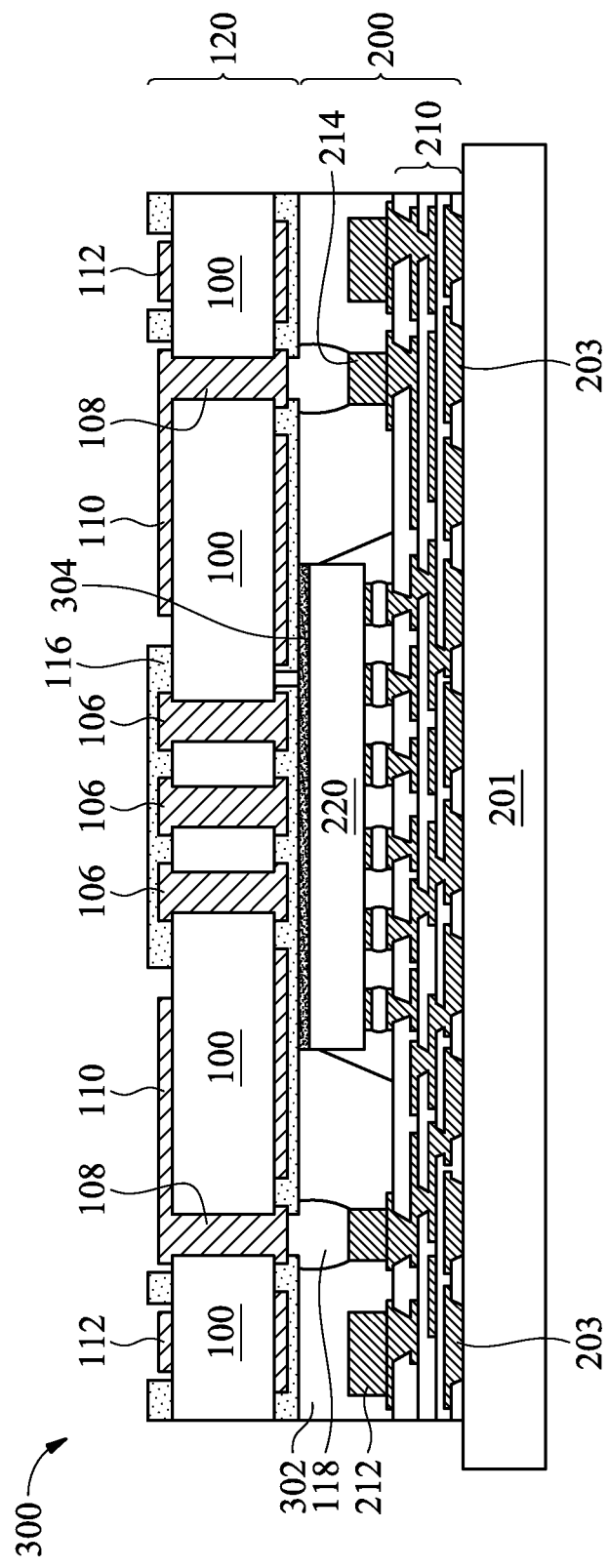
Figure 10C:
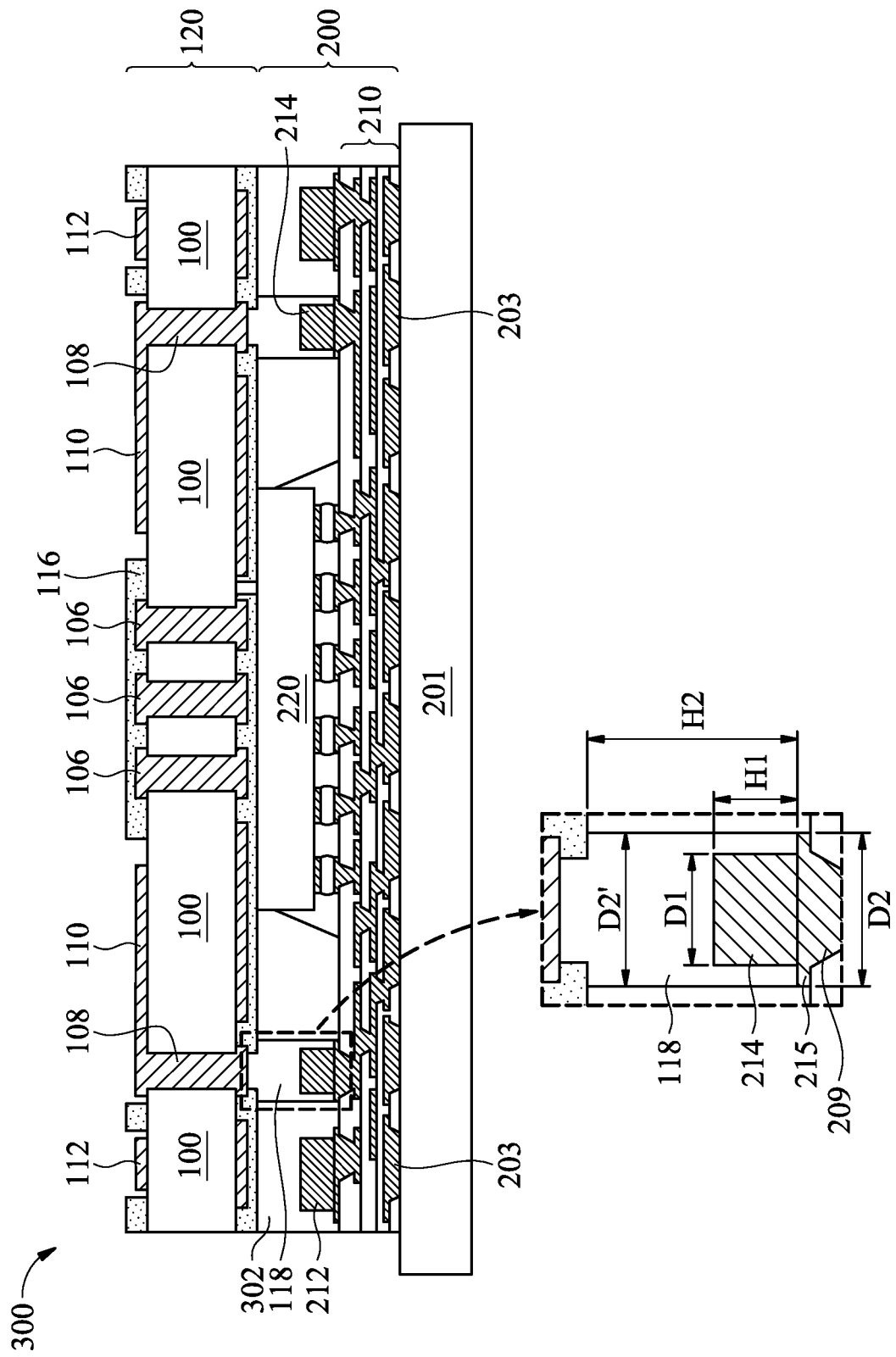
Figure 11:
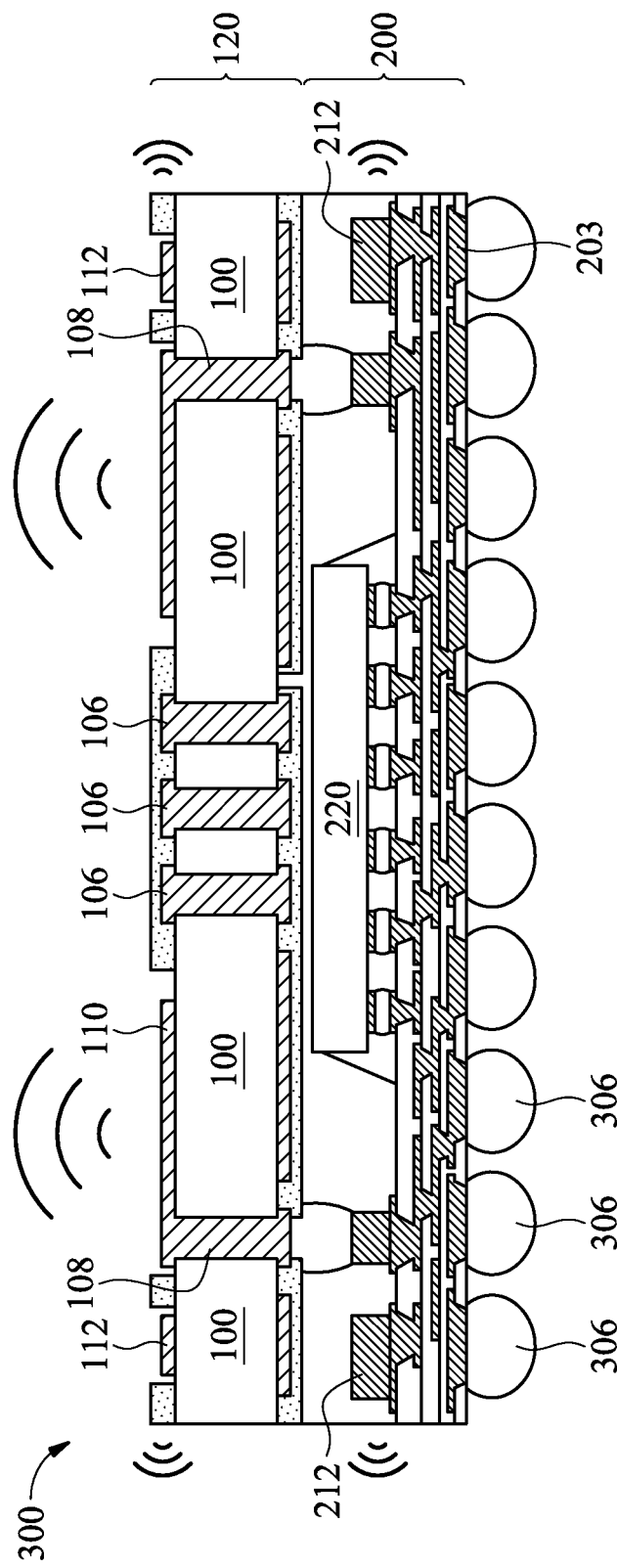

FIGS. 1-11 illustrate intermediate steps of forming an antenna package 300, in accordance with some embodiments. FIGS. 1 through 5 illustrate cross-sectional views and plan views of intermediate steps of forming an antenna structure 120 (see FIG. 5), in accordance with some embodiments. FIGS. 6A through 9B illustrate cross-sectional views and plan views of intermediate steps of forming a device structure 200 (see FIGS. 9A-B), in accordance with some embodiments. FIGS. 10A-C illustrate cross-sectional views of intermediate steps of forming an antenna package 300, in accordance with some embodiments. FIG. 11 illustrates a cross-sectional view of an antenna package 300, in accordance with some embodiments.

FIG. 1 shows a cross-sectional view of a core substrate 101, in accordance with some embodiments. In some embodiments, the core substrate 101 may be a double-sided copper-clad laminate (CCL) substrate or the like. The core substrate 101 may have a thickness between about 200 μm and about 1000 μm, such as about 400 μm or about 900 μm. In some embodiments, the core substrate 101 includes an insulation substrate 100 having conductive layers 102 disposed on opposite surfaces of the insulation substrate 100. For example, the insulation substrate 100 may be an insulating core, and may include one or more layers of insulating materials such as fiberglass-reinforced resin materials, printed circuit board (PCB) materials, build-up films such as Ajinomoto build-up film (ABF), pre-impregnated composite fiber (prepreg) materials, polymer materials, paper, glass fiber, non-woven glass fabric, glass, ceramic, other laminates, the like, or combinations thereof. The conductive layers 102 may be one or more layers of copper, nickel, aluminum, other conductive materials, or combination thereof laminated or formed onto opposing sides of the insulation substrate 100. In some embodiments, the conductive layers 102 may have a thickness between about 5 μm and about 50 μm. In some cases, the use of an insulation substrate 100 as described can provide greater stability for the antenna structure 120 (see FIG. 5) or for the antenna package 300 (see FIGS. 10A-11).

Referring to FIG. 2, openings 104 are formed in the core substrate 101. In some embodiments, the openings 104 are formed by, for example, a laser drilling technique. Other processes, e.g., mechanical drilling, etching, or the like, may also be used in other embodiments. The openings 104 may have lateral cross-section that is a rectangular shape, a circular shape, or another shape. In some embodiments, the openings 104 may have a lateral cross-section that is between about 50 μm and about 500 μm.

In some embodiments, an optional surface preparation process may be performed after the openings 104 are formed. The surface preparation process may include a process that cleans exposed surfaces of the core substrate 101 with one or more cleaning solutions. The cleaning solutions may include sulfuric acid, chromic acid, a neutralizing alkaline solution, a water rinse, the like, or a combination. In some cases, the surface preparation process removes or reduces residues, oils, native oxide films, etc. In some embodiments, an optional desmear process may be performed to clean regions near the openings 104. The desmear process may be performed in addition to or instead of the surface preparation process. For example, the desmear process may remove residual material of the insulation substrate 100 remaining on surfaces of the core substrate 101. The desmear process may be accomplished mechanically (e.g., blasting with a fine abrasive in a wet slurry), chemically (e.g., rinsing with a combination of organic solvents, permanganate etc.), or by a combination of mechanical and chemical desmearing. Following the surface preparation process or desmear process, a conditioning treatment may be performed using a chemical conditioner that facilitates adsorption of an activator used during subsequent electroless plating. In some embodiments, the conditioning treatment may be followed by micro-etching of the conductive layers 102 to roughen the conductive surface for better bonding between the metal foil and the later deposited conductive material (see FIG. 3A).

Figure 3B:
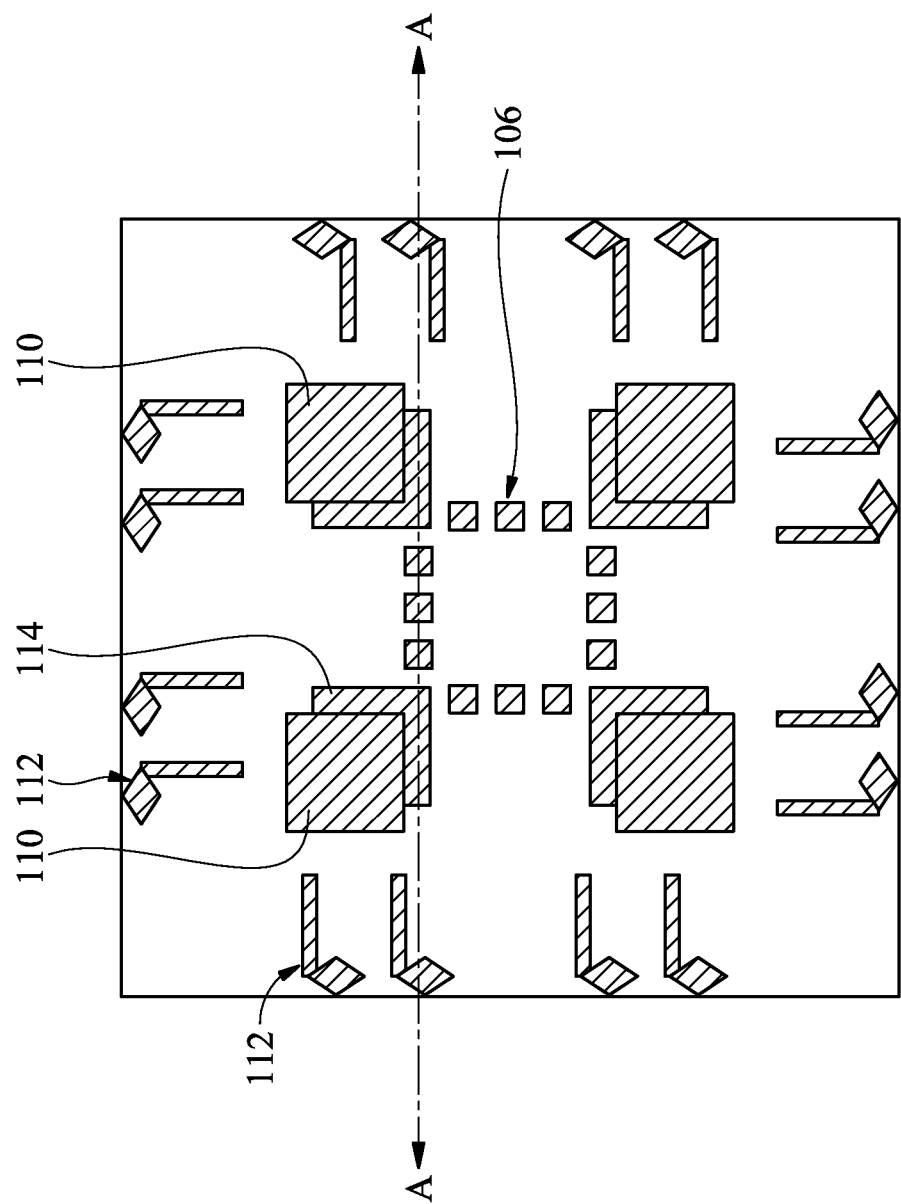

In FIGS. 3A-B, conductive features are formed on surfaces of the insulation substrate 100 and the openings 104 (see FIG. 2) are filled with conductive material to form through-via structures extending through the insulation substrate 100, in accordance with some embodiments. FIG. 3B shows a plan view, and FIG. 3A shows a cross-sectional view along the cross-section A-A' labeled in FIG. 3B. Described in greater detail below, the conductive features may include, for example, patch antennas 110, end-fire antennas 112, other types of driven antennas, parasitic antennas, or arrays of antennas. The conductive features may also include ground planes 114 or other conductive features (e.g., routing, traces, or conductive lines) not shown in FIGS. 3A-B. For example, conductive features may be connected by routing that is not shown in the example cross-sectional views. Described in greater detail below, the through-via structures may include, for example, thermal vias 106, feedline vias 108, or other types of through-vias. As shown in FIGS. 3A-B, some conductive features may be connected to through-via structures.

In some embodiments, the conductive features and through-via structures are formed by first forming a patterned mask over a first side of the core substrate 101. The patterned mask may be, for example, a patterned photoresist layer. Openings in the patterned mask expose portions of the conductive layer 102 on which conductive material will subsequently be formed. The openings in the patterned mask also may expose the openings 104 in the insulation substrate 100. The conductive material may then be deposited on the exposed regions of the conductive layer 102 and within the openings 104 using, for example, a plating process, an electroless plating process, or another process. After depositing the conductive material, the patterned mask layer (e.g., the photoresist) may be removed using a wet chemical process or a dry process (e.g., an ashing process). Portions of the conductive layer 102 that were covered by the patterned mask layer may be removed with the patterned mask layer or using a separate etching process. A similar process may then be performed on the opposite side of the core substrate 101 to form conductive features (or remaining portions of through-vias) on the opposite side of the core substrate 101. In this manner, the conductive material may form conductive features and through-vias.

Although not shown in this example, it is understood that the method of using a core substrate having conductive layers, forming openings extending through the core substrate, forming a patterned conductive material and removing unwanted portions of the conductive layers may be performed repeatedly to vertically stack multiple alternating layers of insulation material and conductive material with through-vias for connecting vertically adjacent layers having conductive features.

The conductive features formed may include one or more patch antennas 110, such as those shown in FIGS. 3A-B. The patch antennas 110 may be formed on a top surface of the insulation substrate 100. The patch antennas 110 may be configured to operate in the microwave spectrum, such as at a frequency of about 28 GHz or at one or more other frequencies. The patch antennas 110 may be configured to operate having a directionality that is mostly normal to (e.g., perpendicular to) the top surface of the insulation substrate 100 (see FIG. 11). In some embodiments, the radiation direction of a patch antenna 110 is adjustable, and may be controlled by the locations and/or number of power feed lines 108 connected to the patch antenna 110 (multiple power feed lines 108 are not shown in FIGS. 3A-B). Four patch antennas 110 are shown in FIG. 3B, but any number of patch antennas 110 may be disposed in any arrangement on the top surface of the insulation substrate 100. The patch antennas 110 may be the same size and shape or have different sizes or different shapes. The patch antennas 110 may have a rectangular shape or another shape, and may have lateral dimensions between about 1.0 mm and about 10 mm. As shown in FIG. 3A, groundplanes 114 for the patch antennas 110 may be formed on the bottom surface of the insulation substrate 100. The groundplanes 114 may be electrically grounded relative to the patch antennas 110, and are configured such that a changing electric field is generated between a patch antenna 110 and its corresponding groundplane 114 during operation of the patch antenna 110. In some embodiments, the groundplanes 114 may be formed in a layer within the insulation substrate 100 or may be external to the antenna structure 120. A patch antenna 110 may be electrically connected to a feedline via 108, through which the patch antenna 110 may be driven. In other embodiments, the patch antenna 110 is driven through a conductive trace disposed on the top surface of the insulation substrate 100 (not shown in FIGS. 3A-B).

Figure 12:
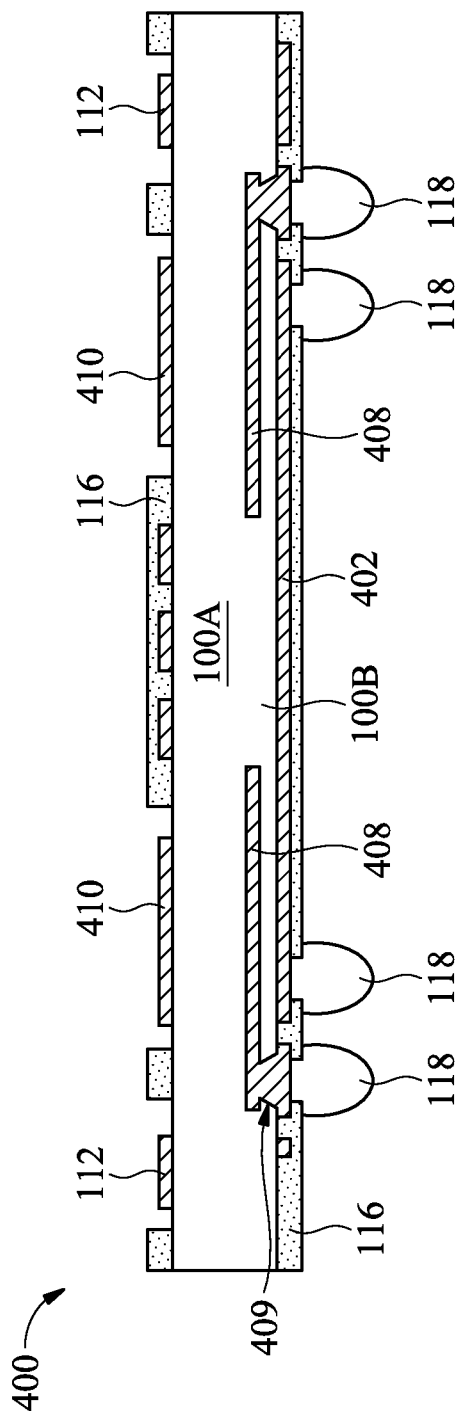
FIGS. 12 through 16 illustrate cross-sectional views of intermediate steps of forming an antenna package, in accordance with some embodiments.

In some embodiments, the patch antenna 110 is parasitically driven. (An example parasitic patch antenna 410 is shown in FIG. 12.) In a parasitically driven antenna, the antenna itself is electrically isolated, and an adjacent conductive feature is driven. Changing electric fields are generated in the driven conductive feature, and these electric fields interact with the antenna and create changing electric fields within the antenna. The changing electric fields created within the antenna cause the antenna to radiate. In this manner, the parasitic antenna is parasitically driven by the conductive feature. More than one antenna may be parasitically driven by a single conductive feature. The conductive feature may be, for example, a conductive trace, a via, a directly driven antenna, another parasitically driven antenna, a combination, or the like.

The conductive features may also include one or more end-fire antennas 112, such as those shown in FIGS. 3A-B. The end-fire antennas 112 may be formed on a top surface of the insulation substrate 100. The end-fire antennas 112 may be parasitic antennas, and may be parasitically driven by the patch antennas 110 such that both the end-fire antennas 112 and the patch antennas 110 operate together. The end-fire antennas 112 may be configured to operate in the microwave spectrum, such as at a frequency of about 28 Ghz or at one or more other frequencies, which may include frequencies used by patch antennas 110. The end-fire antennas 112 may be configured to operate having a directionality that is mostly parallel to the top surface of the insulation substrate 100 (see FIG. 11). Four end-fire antennas 112 near each edge of the insulation substrate 100 are shown in FIG. 3B, but any number of end-fire antennas 112 may be disposed in any arrangement on the top surface of the insulation substrate 100. The end-fire antennas 112 may be the same size and shape or have different sizes or different shapes. The end-fire antennas 112 shown in FIG. 3B are intended as representative examples. The end-fire antennas 112 have an L-shape similar to the embodiment shown in FIG. 3B, but may also have any suitable shape in other embodiments, such as a rectangular shape, an irregular shape, a T-shape, a 2L-shape (e.g., two mirrored L-shapes), an H-shape, the like, or another shape. In some cases, an end-fire antenna 112 may include multiple separated regions, such as an array of parallel lines, though any suitable shapes or combinations of shapes may be used. The end-fire antennas 112 may have lateral dimensions between about 0.6 mm and about 3.0 mm. The embodiments described herein allow for both patch antennas 110 and end-fire antennas 112 to be formed on the same substrate, which may allow for the overall antenna structure 120 (see FIG. 5) to have a greater antenna coverage (i.e., a larger directionality pattern).

The through-vias formed may include one or more feedline vias 108 and one or more thermal vias 106, such as those shown in FIGS. 3A-B. The feedline vias 108 may extend through the insulation substrate 100 to provide electrical connection to patch antennas 110 or other conductive features disposed on the top surface of the insulation substrate 100. A feedline via 108 may be aligned to a corresponding patch antenna 110 to connect to that patch antenna 110 at any suitable location on that patch antenna 110. In some embodiments, a patch antenna 110 may be connected to more than one feedline via 108. In some cases, some conductive material may be formed over an end of a feedline via 108 such that the conductive material extends over a surface of the insulation substrate 100. In some embodiments, the feedline vias 108 have a lateral width within the insulation substrate 100 that is between about 10 μm and about 300 μm.

The thermal vias 106 may extend through the insulation substrate 100 to facilitate the transfer of heat away from a device (e.g., semiconductor device 220, see FIG. 11). The use of thermal vias 106 in this manner may allow for improved thermal dissipation, which can improve performance and reduce the chance of undesired thermal effects, such as temperature-related changes to antenna performance. FIGS. 3A-B show an example arrangement of thermal vias 106, but any number of thermal vias 106 may be formed in any arrangement. In some cases, some conductive material may be formed over an end of a thermal via 106 such that the conductive material extends over a surface of the insulation substrate 100. In some embodiments, the thermal vias 106 have a lateral width within the insulation substrate 100 that is between about 50 μm and about 500 μm.

Figure 4:
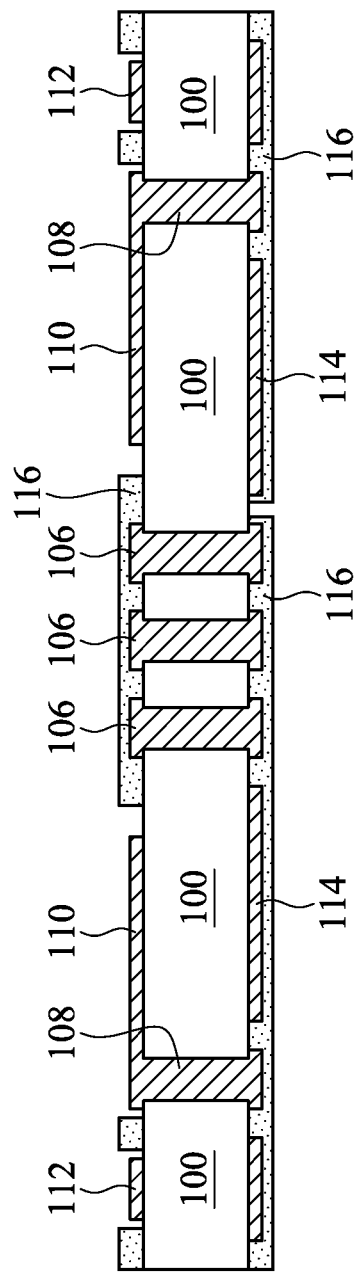

Turning now to FIG. 4, a patterned protective layer 116 is formed over both surfaces of the insulation substrate 100, in accordance with some embodiments. The protective layer 116 may be a solder resist material, and may be formed to protect portions of the insulation substrate 100, groundplanes 114, through-vias such as thermal vias 106 or feedline vias 108, or other conductive features. In some embodiments, the protective layer 116 may be a photosensitive material. The photosensitive material may first be formed over the insulation substrate 100 by printing, lamination, spin-coating, or the like. The photosensitive material may then be exposed to an optical pattern and developed, forming openings in the photosensitive material. In other embodiments, the protective layer 116 may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). The protective layer 116 may be formed and patterned over both sides of the insulation substrate 100 using the same techniques. In some embodiments, the protective layer 116 may have a thickness between about 10 μm and about 100 μm. Other processes and materials may also be used.

In some embodiments, an optional solderability treatment may then be performed on the exposed surfaces of the feedline vias 108, patch antennas 110, end-fire antennas 112, groundplanes 114, or other conductive features. The treatment may include an electroless nickel-electroless palladium-immersion gold technique (ENEPIG) process, an organic solderability preservative (OSP) process, or the like.

Figure 5:
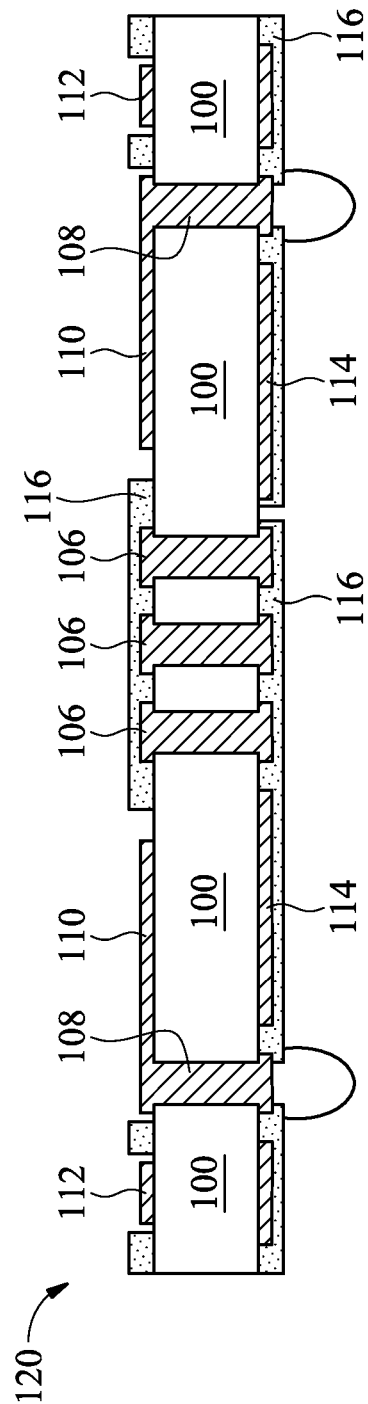

Turning to FIG. 5, conductive connectors 118 are then formed on exposed portions of the feedline vias 108 to form the antenna structure 120, in accordance with some embodiments. For example, as shown in FIG. 5, connectors 118 may be formed on exposed bottom ends of the feedline vias 108. In some embodiments, conductive connectors 118 may be formed on exposed portions of other conductive features. The connectors 118 may be, for example, ball grid array (BGA) connectors, solder balls, metal pillars, controlled collapse chip connection (C4) bumps, micro bumps, or the like. The connectors 118 may include a material such as solder, lead-free solder, copper, aluminum, gold, nickel, silver, palladium, tin, the like, or a combination thereof. In some embodiments, the connectors 118 are formed by initially forming a layer of solder through a technique such as evaporation, electroplating, printing, solder transfer, ball placement, or the like. Once a layer of solder has been formed on the structure, a reflow may be performed in order to shape the material into the desired bump shapes.

Figure 6A:
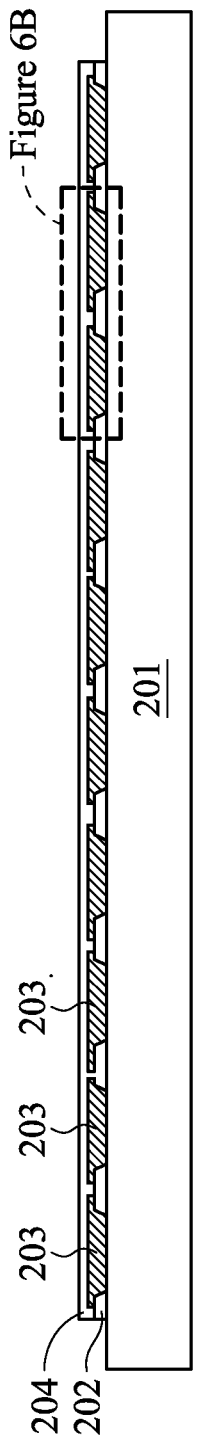

Turning now to FIGS. 6A through 9B, cross-sectional views and plan views of intermediate steps of forming a device structure 200 (see FIGS. 9A-B) are illustrated, in accordance with some embodiments. With reference now to FIG. 6A, there is illustrated a carrier substrate 201 and a redistribution layer 203 over the carrier substrate 201. In an embodiment, the carrier substrate 201 includes, for example, silicon based materials, such as glass or silicon oxide, or other materials, such as aluminum oxide, combinations of any of these materials, or the like. The carrier substrate 201 may be planar in order to accommodate a formation of the redistribution structure 210 (see FIG. 7) or other subsequently formed layers.

In some embodiments, a release layer (not shown in FIG. 6A) may be formed on the top surface of the carrier substrate 201 to facilitate subsequent debonding of the carrier substrate 201. The release layer may be formed of a polymer-based material, which may be removed along with the carrier substrate 201 from the overlying structures that will be formed in subsequent steps. In some embodiments, the release layer is an epoxy-based thermal-release material, which loses its adhesive property when heated, such as a Light-to-Heat-Conversion (LTHC) release coating. In other embodiments, the release layer may be an ultra-violet (UV) glue, which loses its adhesive property when exposed to UV light. The release layer may be dispensed as a liquid and cured, may be a laminate film laminated onto the carrier substrate 201, or the like. The top surface of the release layer may be leveled and may have a high degree of co-planarity.

FIG. 6A shows the formation of a redistribution layer 203 and insulating layers 202 and 204 over the carrier substrate 201, in accordance with some embodiments. The redistribution layer 203 and insulating layers 202 and 204 may be part of a redistribution structure, such as redistribution structure 210 shown in FIG. 7. In an embodiment, the insulating layer 202 is formed over the carrier substrate 201 (or release layer, if present). The insulating layer 202 may be made of one or more suitable dielectric materials such as an oxide (e.g., silicon oxide), a nitride (e.g., silicon nitride), a polymer material, a low-k dielectric material, another dielectric material, combinations of these, or the like. The insulating layer 202 may be formed by a process such as spin-coating, lamination, CVD, the like, or a combination thereof. The insulating layer 202 may have a thickness of between about 2 µm and about 25 µm, such as about 7 µm, although any suitable thickness may be used. Openings into the insulating layer 202 may be formed using a suitable photolithographic mask and etching process. For example, a photoresist may be formed and patterned over the insulating layer 202, and one or more etching processes (e.g., a wet etch process or a dry etch process) are utilized to remove portions of the insulating layer 202. In some embodiments, the insulating layer 202 is formed of a photosensitive polymer such as PBO, polyimide, BCB, or the like, in which openings may be patterned directly using a photolithographic mask and etching process.

In an embodiment, the redistribution layer 203 may be formed by initially forming a seed layer (not shown) of one or more layers of titanium, copper, or a titanium copper alloy through a suitable formation process such as PVD, CVD, sputtering, or the like. The seed layer is formed over the insulating layer 202 and within openings in the insulating layer 202. A photoresist (also not shown) may then be formed to cover the seed layer and then be patterned to expose those portions of the seed layer that are located where the redistribution layer 203 will subsequently be formed. Once the photoresist has been formed and patterned, a conductive material may be formed on the seed layer. The conductive material may be a material such as copper, titanium, tungsten, aluminum, another metal, a combination, or the like. The conductive material may be formed through a deposition process such as electroplating or electroless plating, or the like. However, while the material and methods discussed are suitable to form the conductive material, these materials are merely examples. Any other suitable materials or any other suitable processes of formation, such as CVD or PVD, may alternatively be used to form the redistribution layer 203. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the redistribution layer 203.

In some embodiments, the redistribution layer 203 may be formed using an electrochemical deposition process that fills the openings in the insulating layer 202 with conductive material such that the conductive material remains approximately level during deposition. In some embodiments, the electrochemical deposition process is a copper electroplating process in which the electroplating solution comprises metal ions, an accelerator additive, a suppressor additive, and/or a leveler additive In some embodiments, the electroplating solution includes the metal ions to be electroplated (e.g., copper ions) and the associated anions in an acid solution. In some embodiments, the electroplating solution may comprise one or more copper salts that provide copper ions, including, for example copper sulfate, copper sulfonate, copper acetate, copper gluconate, copper fluoroborate, cupric nitrate, copper alkanesulfonates, copper arylsulfonates, the like, or a combination In some embodiments, the copper salt is present in an amount sufficient to provide an amount of copper ions between about 10 g/L and about 180 g/L in the electroplating solution. The electroplating solution may also comprise alloying elements or chloride ions, in some embodiments. In some embodiments, the acid solution comprises an acid such as sulfuric acid, nitric acid, methanesulfonic acid, phenylsulfonic acid, the like, or a combination thereof. In some embodiments, the electrochemical deposition process is performed at a temperature between about 20° C. and about 60° C. In some embodiments, the current density of the electrochemical deposition process is between about 1 ASD and about 10 ASD.

In some embodiments, the accelerator additive is configured to increase the rate of the electroplating reaction. In some embodiments, the accelerator additive is a molecule which adsorbs on surfaces and increases the local current density at a given applied voltage. In some embodiments, the accelerator additive contains pendant sulfur atoms, which may participate in the cupric ion reduction reaction and thus strongly influence the nucleation and surface growth of metal films. In some embodiments, the accelerator additive comprises bis-(3-sulfopropyl) disulfide (SPS), mercaptopropanesulfonic acid (MPS), dimercaptopropanesulfonic acid (DPS), ethylenedithiodipropyl sulfonic acid, bis-(ω-sulfobutyl)-disulfide, methyl-(ω-sulfopropyl)-disulfide, N,N-dimethyldithiocarbamic acid (3-sulfopropyl) ester, (O-ethyldithiocarbonato)-S-(3-sulfopropyl)-ester, 3-[(amino-iminomethyl)-thiol]-1-propanesulfonic acid, 3-(2-benzylthiazolylthio)-1-propanesulfonic acid, bis-(sulfopropyl)-disulfide, alkali metal salts thereof, its derivatives, the like, or a combination thereof. In some embodiments, the accelerator additive has a molecular weight of 100 to 400. In some embodiments, the accelerator additive has a molar concentration between about 10 mol/L and about 20 mol/L.

In some embodiments, the suppressor additive comprises a polymer and is configured to decrease the local current density at a given applied voltage, thus retarding electroplating. In some embodiments, the suppressor additive comprises a polyether compound. In some embodiments, the suppressor additive comprises polyalkylene oxide random copolymers including as polymerized units two or more alkylene oxide monomers or ethylene oxide-propylene oxide random copolymers. In some embodiments, the suppressor additive is derived from polyethylene oxide (PEO), polypropylene oxide (PPO), polyethylene glycol (PEG), polypropylene glycol (PPG), or their derivatives or copolymers. In some embodiments, the suppressor additive has a molecular weight between about 10000 and about 15000. In some embodiments, the suppressor additive has a molar concentration between about 5 mol/L and about 20 mol/L.

In some embodiments, the leveler additive refers to an organic additive that is capable of providing a substantially planar metal electroplating layer. In some embodiments, the leveler additive comprises one or more nitrogen, amine, imide, imidazole or pyrrolidone groups, and may also comprise sulfur functional groups. In some embodiments, the leveler additive comprises one or more five- and six-member rings and/or conjugated organic compound derivatives. In some embodiments, nitrogen groups may form part of the ring structure. In some embodiments, in the amine-containing leveler additives, the amines are primary, secondary or tertiary alkyl amines. In some embodiments, the amine is an aryl amine or a heterocyclic amine. In some embodiments, the amines include, but are not limited to, dialkylamines, trialkylamines, arylalkylamines, triazoles, imidazole, triazole, tetrazole, benzimidazole, benzotriazole, piperidine, morpholines, piperazine, pyridine, pyrrolidone, oxazole, benzoxazole, pyrimidine, quonoline, isoquinoline, the like, or a combination thereof. In some embodiments, the leveler additive comprises polyvinylpyrrolidone (PVP). In some embodiments, the leveler additive has a molecular weight of 100 to 10000. In some embodiments, the leveler additive has a molar concentration of 10 mol/L to 20 mol/L.

In some embodiments, the concentration of accelerator additive and the leveler additive in the electroplating solution is approximately equal. By having similar concentrations of accelerator additive and leveler additive, the redistribution layer 203 may be formed having a more level surface (e.g., with less dishing or bumps) in redistribution layers 203 of different dimensions (e.g., first redistribution layer portion 203A and second redistribution layer portion 203B, discussed below). In some cases, a higher concentration of leveler additive can release surface tension in larger deposition areas (e.g., 203B), which allows for a more level surface. In some cases, a higher concentration of accelerator additive can improve the planarity of smaller deposition areas (e.g., 203A). In some cases, the individual concentrations of accelerator additive and leveler additive may be between about 1-2 times as much as the concentration of suppressor additive.

In some embodiments, a patterned photoresist may be formed to cover portions of the insulating layer 202 on which conductive material is not wished to be deposited. After the conductive material is formed in this manner, the top surface of the conductive material formed within the openings may be about level with the top surface of the conductive material formed over the insulating layer 202. The use of this deposition process may allow for more planar redistribution structures, which can reduce the chance of process defects and allow for a thinner structure. Once the conductive material has been formed, the photoresist may be removed through a suitable removal process such as ashing or chemical stripping. The remaining portions of the conductive material form the redistribution layer 203.

In an embodiment, an insulating layer 204 is formed over the redistribution layer 203 and insulating layer 202, which may be formed in a process and with materials similar to the insulating layer 202. Alternatively, the insulating layer 204 may be formed differently than the insulating layer 202.

Figure 6B:
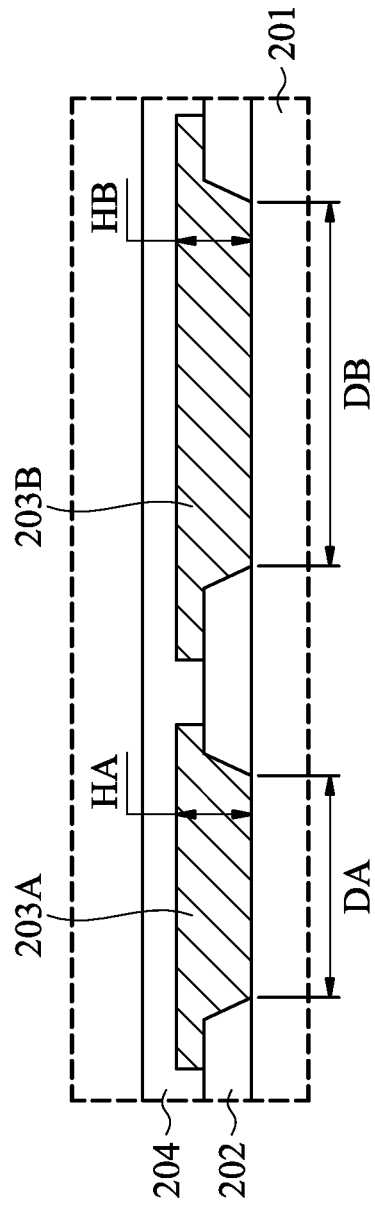

In some embodiments, the openings formed in the insulating layer 202 may be of different sizes, such that the conductive material subsequently deposited in the openings forms portions of the redistribution layer 203 within the insulating layer 202 have different dimensions. As an example, FIG. 6B illustrates a representative close-up view of a region of the structure shown in FIG. 6A. FIG. 6B shows a first redistribution layer portion 203A and a second redistribution layer portion 203B formed in two differently-sized openings in the insulating layer 202, according to some embodiments. The first redistribution layer portion 203A has a bottom length DA and a height HA, and the second redistribution layer portion 203B has a bottom length DB and a height HB. In some embodiments, the length DA may be between about 20 μm and about 100 μm, and the length DB may be between about 100 μm and about 400 μm. In some embodiments, a ratio of DB to DA may be between about 1:1 and about 20:1. In some embodiments, the height HA or the height HB may be between about 2 μm and about 15 μm. In some embodiments, a ratio of HB to HA may be between about 0.7:1 and about 1.3:1.

In some embodiments, the use of redistribution layer 203 portions having different dimensions (e.g., lengths DA or DB) may allow for external connectors (e.g., solder balls or the like) of different sizes to be formed on the redistribution layer 203 portions. For example, an external connector having a smaller size may subsequently be connected to redistribution layer portion 203A than an external connector connected to redistribution layer portion 203B. For example, an integrated passive device (IPD) may be connected to the redistribution layer 203, and may be able to be connected using smaller external connectors. In this manner, connectors of different sizes may be used to more efficiently use space, which may allow for smaller package size. By allowing for more level deposition in redistribution layer portions having different dimensions, the use of the electrochemical deposition process described above can facilitate the use of redistribution layer portions having different dimensions by improving process uniformity and improving electrical connections to the redistribution layer portions.

Figure 7:
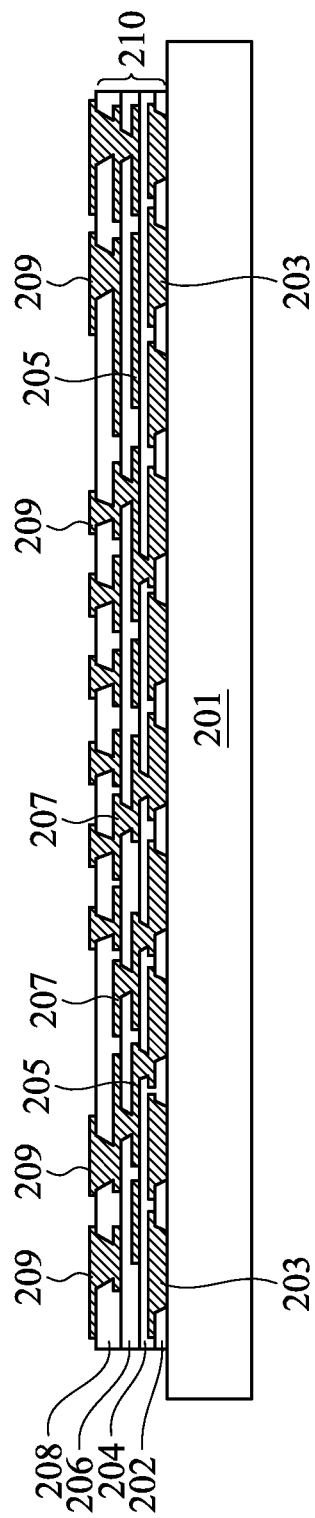

Turning to FIG. 7, additional insulating layers and redistribution layers are used to form redistribution structure 210. In an embodiment, after the insulating layer 204 has been formed over the redistribution layer 203, openings may be made through the insulating layer 204 by removing portions of the insulating layer 204 to expose at least a portion of the underlying redistribution layer 203. The openings allow for contact between the redistribution layer 203 and an overlying redistribution layer 205 (described further below). The openings may be formed using a suitable photolithographic mask and etching process, although any suitable process to expose portions of the redistribution layer 203 may alternatively be used.

The redistribution layer 205 may be formed to provide additional routing along with electrical connection within the redistribution structure 210. In an embodiment, the redistribution layer 205 may be formed using materials and processes similar to the redistribution layer 203. For example, a seed layer may be formed, a photoresist may be placed and patterned on top of the seed layer in a desired pattern for the redistribution layer 205, conductive material is plated into the patterned openings of the photoresist, the photoresist is removed, and the seed layer is etched. The redistribution layer 205 may also be formed using an electrochemical deposition process.

After the redistribution layer 205 has been formed, an insulating layer 206 may be formed over the redistribution layer 205. In an embodiment, the insulating layer 206, which may be similar to the insulating layers 202 or 204, may be formed from a polymer such as PBO, or may be formed of a similar material as the insulating layer 202 or 204 (e.g., polyimide or a polyimide derivative). The insulating layer 206 may be formed to have a thickness of between about 2 μm and about 15 μm, such as about 5 μm.

After the insulating layer 206 has been formed, openings may be made through the insulating layer 206 by removing portions of the insulating layer 206 to expose at least a portion of the underlying redistribution layer 205. The openings allow for contact between the redistribution layer 205 and an overlying redistribution layer 207. The openings may be formed using a suitable photolithographic mask and etching process, although any suitable process to expose portions of the redistribution layer 205 may be used.

The redistribution layer 207 may be formed to provide additional routing along with electrical connection within the redistribution structure 210. In an embodiment, the redistribution layer 207 may be formed using materials and processes similar to the redistribution layers 203, or 205. For example, a seed layer may be formed, a photoresist may be placed and patterned on top of the seed layer in a desired pattern for the redistribution layer 207, conductive material is plated into the patterned openings of the photoresist, the photoresist is removed, and the seed layer is etched.

After the redistribution layer 207 has been formed, an insulating layer 208 may be formed over the redistribution layer 207. In an embodiment, the insulating layer 208, which may be similar to the insulating layers 202, 204, or 206, may be formed from a polymer such as PBO, or may be formed of a similar material as the insulating layer 202, 204 or 206 (e.g., polyimide or a polyimide derivative). The insulating layer 208 may be formed to have a thickness of between about 2 μm and about 15 μm, such as about 5 μm.

After the insulating layer 208 has been formed, openings may be made through the insulating layer 208 by removing portions of the insulating layer 208 to expose at least a portion of the underlying redistribution layer 207. The openings allow for contact between the redistribution layer 207 and an overlying redistribution layer 209. The openings may be formed using a suitable photolithographic mask and etching process, although any suitable process to expose portions of the redistribution layer 207 may be used.

The redistribution layer 209 may be formed to provide additional routing along with electrical connection within the redistribution structure 210. In an embodiment, the redistribution layer 209 may be formed using materials and processes similar to the redistribution layers 203, 205, or 207. For example, a seed layer may be formed, a photoresist may be placed and patterned on top of the seed layer in a desired pattern for the redistribution layer 209, conductive material is plated into the patterned openings of the photoresist, the photoresist is removed, and the seed layer is etched. In other embodiments, different numbers of insulating layers or redistribution layers may be formed in the redistribution structure 210 than those described herein. In some embodiments, the redistribution structure 210 may be, for example, a fan-out structure.

Figure 8A:
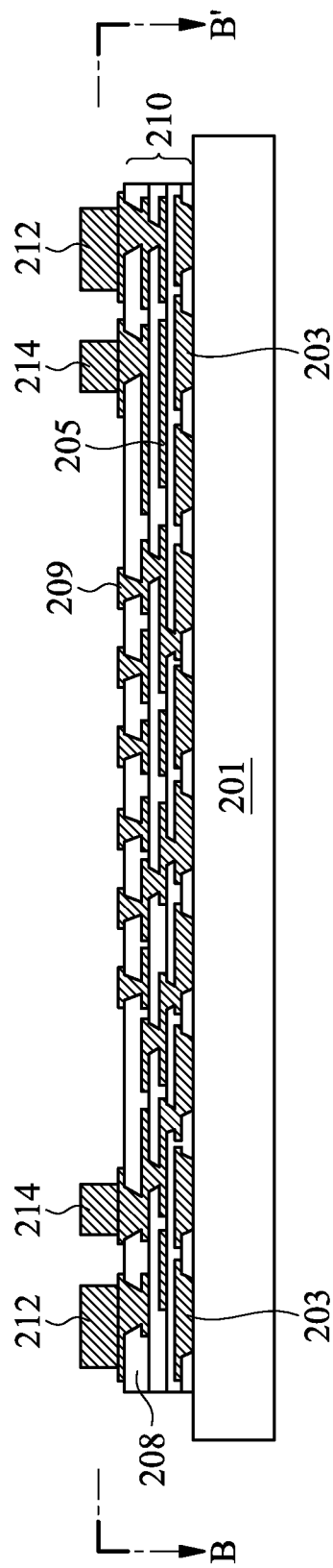
Figure 8B:
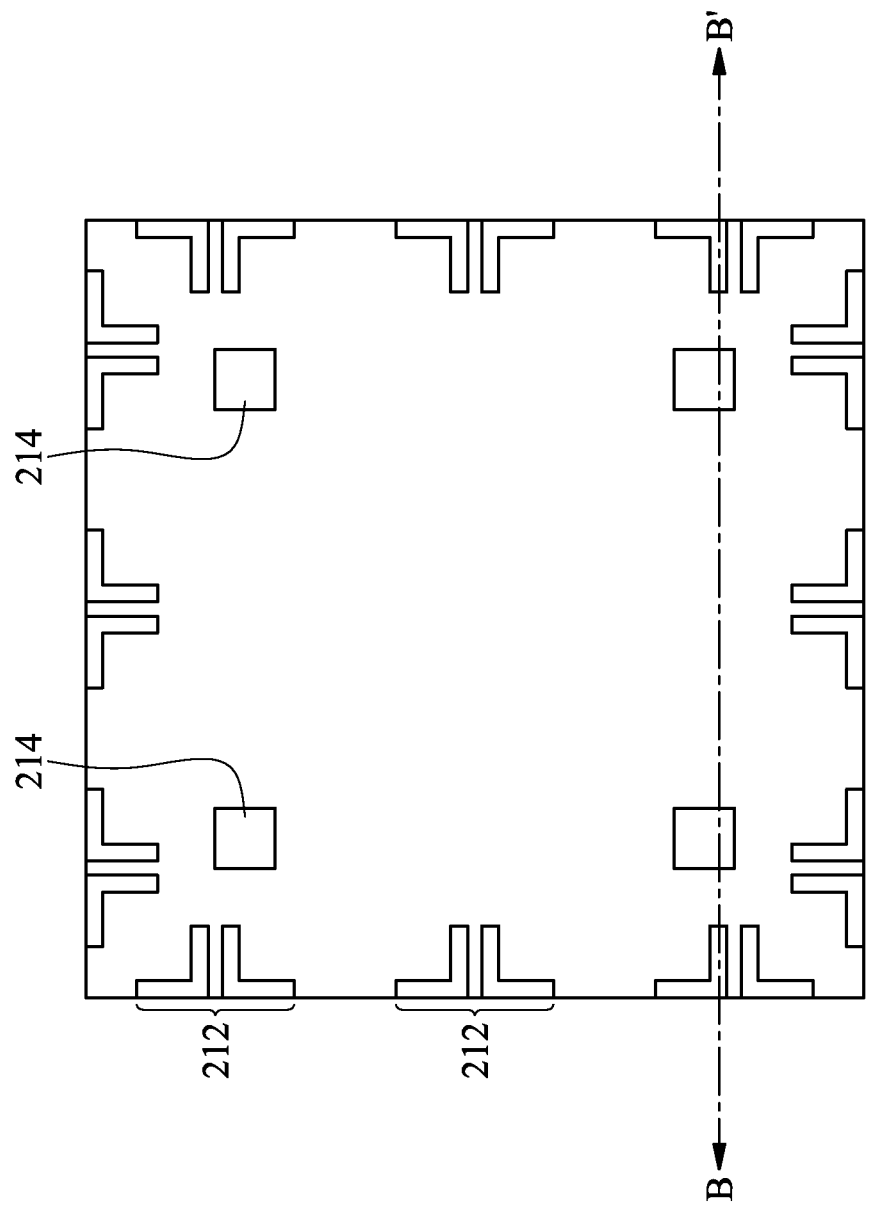

Turning to FIGS. 8A-B, conductive pillars 214 and dipole antennas 212 are formed over the redistribution layer 209. FIG. 8B shows a plan view, and FIG. 8A shows a cross-sectional view along the cross-section B-B' labeled in FIG. 8B. In some embodiments, the conductive pillars 214 and dipole antennas 212 are formed by initially forming a photoresist over the insulating layer 208 and redistribution layer 209 and then patterning the photoresist into the desired pattern for the conductive pillars 214 and dipole antennas 212. The patterned photoresist may expose portions of the redistribution layer 209. The conductive material (e.g., copper or the like) may be formed over the patterned photoresist to form the conductive pillars 214 and dipole antennas 212. The conductive material may be formed using a suitable process such as plating, electroless plating, CVD, PVD, or the like. After deposition of the conductive material, the photoresist and any excess conductive material may be removed using, for example, a wet chemical process and/or a dry process (e.g., an ashing process).

In some embodiments, the conductive pillars 214 and the dipole antennas 212 may be formed having a thickness between about 40 μm and about 400 μm. The conductive pillars 214 may have a rectangular shape, a circular shape, or another shape, and may be formed having a width between about 40 μm and about 300 μm. The dipole antennas 212 may be formed having any suitable dimensions or shape, which may depend on the antenna frequencies appropriate for the application, or which may depend on other desired antenna characteristics. In some embodiments, different dipole antennas 212 having different dimensions may be formed on the same structure. In some embodiments, the dipole antenna 212 comprises an L-shaped element having a width between about 0.6 mm and about 5 mm and a length between about 0.6 mm and about 5 mm. FIG. 8B shows an embodiment having three dipole antennas 212 on each side of the structure and four conductive pillars 214, but any number of conductive pillars 214 or dipole antennas 212 may be formed having any suitable arrangement. In some cases, forming the dipole antennas 212 on the redistribution layer 209 may decrease the routing distance between the dipole antennas 212 and semiconductor devices 220 (see FIGS. 9A-B below) connected to the redistribution layer 209. Decreasing the routing distance can decrease power consumption, improve power integrity, and/or improve the signal-to-noise ratio of the dipole antennas 212.

FIGS. 9A-B illustrate connections of semiconductor devices 220 to the redistribution structure 210, according to some embodiments. Connecting one or more semiconductor devices 220 to the redistribution structure 210 forms a device structure 200. FIG. 9A shows an embodiment of a device structure 200 in which one semiconductor device 220 is connected to the redistribution structure 210, and FIG. 9B shows an embodiment of a device structure 200 in which multiple semiconductor devices 220A and 220B are connected to the redistribution structure 210. The semiconductor devices 220A and 220B may be different types of semiconductor devices. In other embodiments, more than two semiconductor devices 220 may be connected to the redistribution structure 210. In some embodiments, a semiconductor device 220 may be a device that provides logic functions for connected structures, a radio frequency chip (e.g., an RFIC), a radio frequency front end (RFFE) device, an amplifier device (e.g., a low-noise amplifier or a power amplifier), a filter device (e.g., a low-loss filter), a baseband logic device, a power management integrated circuit (PMIC), a surface mounted device (SMD), the like, or a combination.

In some embodiments, the semiconductor device 220 includes contact pads 221 electrically connected to the semiconductor device 220. The contact pads 221 may be connected to the redistribution layer 209 of the redistribution structure 210 by external connectors 222, thus connecting the semiconductor device 220 to the redistribution structure 210. The external connectors 222 may be conductive bumps (e.g., microbumps) or conductive pillars utilizing materials such as solder and copper. In an embodiment in which the external connectors 222 are contact bumps, the external connectors 222 may include a material such as tin or other suitable materials, such as silver, lead-free tin, or copper. In an embodiment in which the external connectors 222 are tin solder bumps, the external connectors 222 may be formed by initially forming a layer of tin through such commonly used methods such as evaporation, electroplating, printing, solder transfer, ball placement, etc., to a thickness of, e.g., about 20 μm. Once a layer of tin has been formed on the structure, a reflow may be performed in order to shape the material into the desired bump shape.

Once formed, the semiconductor device 220 may be placed on the redistribution layer 209 using, e.g., a pick and place tool. For example, the external connectors 222 of the semiconductor device 220 may be aligned with and placed in physical contact with corresponding locations of the redistribution layer 209. Once in physical contact, a reflow process may be performed in order to reflow the first external connectors 222 and bond the semiconductor device 220 with the redistribution layer 209. For the embodiment shown in FIG. 9B, both semiconductor devices 220A and 220B may be placed and bonded using a similar technique. After bonding, a semiconductor device 220 may have a height above the redistribution structure 210 that is greater than the height of the dipole antennas 212 or conductive pillars 214, as shown in FIGS. 9A-B, but a semiconductor device 220 may have a height above the redistribution structure 210 that is about the same or less than the height of the dipole antennas 212 or conductive pillars 214 in other embodiments. In some embodiments, a semiconductor device 220 and a dipole antenna 212 or conductive pillar 214 may have a difference in heights that is between about 50 μm and about 300 μm. In some embodiments, different semiconductor devices 220 (e.g., 220A and 220B) may have different heights above the redistribution structure 210 after bonding.

Once the semiconductor device 220 has been bonded (multiple semiconductor devices 220A and 220B may be bonded either simultaneously or separately), an underfill material 223 may be placed between the redistribution structure 210 and the semiconductor device 220 (or between the redistribution structure 210 and the semiconductor devices 220A and 220B) in order to help protect and isolate the devices. In an embodiment, the underfill material 223 is a protective material used to cushion and support the semiconductor device 220 from operational and environmental degradation, such as stresses caused by the generation of heat during operation. The underfill material 223 may include, for example, a liquid epoxy or other protective material, which may be cured to harden, and which may be dispensed by, e.g., injection.

FIG. 10A illustrates a placement of the antenna structure 120 into electrical connection with the device structure 200, forming antenna package 300. In an embodiment, the connectors 118 (on the antenna structure 120) are placed into physical contact with the conductive pillars 214 of the device structure 200 using, e.g., a pick and place process. Once in physical contact, a reflow process may be utilized to bond the connectors 118 of the antenna structure 120 to the conductive pillars 214. In some embodiments, a vertical gap is present between a top surface of a semiconductor device 220 and a bottom surface of the antenna structure 120, which may be between about 10 μm and about 100 μm. In some embodiments, no vertical gap is present between the semiconductor device 220 and the antenna structure 120.

Once the antenna structure 120 has been connected to the device structure 200, a molding material 302 may be formed between the antenna structure 120 and the device structure 200. In an embodiment, the molding material 302 may be an encapsulant or a molding compound and may be placed using a molding device. For example, the carrier substrate 201 may be placed within a cavity of the molding device, and the cavity may be hermetically sealed. The molding material 302 may be placed within the cavity either before the cavity is hermetically sealed or else may be injected into the cavity through an injection port. In other embodiments, the molding material 302 may be formed using another suitable technique. In some embodiments, the molding material 302 may be a molding compound resin such as polyimide, PPS, PEEK, PES, a heat resistant crystal resin, combinations of these, or the like. In some embodiments, the molding material 302 may be an underfill material such as a molding underfill material. In some embodiments, the molding material 302 may have the same composition as the underfill material 223. In some embodiments, the molding material 302 may be cured after formation, for example, using a heating process, exposure to UV radiation, or another suitable process.

By disposing the semiconductor device 220 between the redistribution structure 210 and the antenna structure 120, the semiconductor device 220 may be located closer to features such as dipole antennas 212 or patch antennas 110, which can reduce power consumption and improve higher-frequency operation of the antenna package 300. Additionally, the thermal vias 106 of the antenna structure 120 being disposed above the semiconductor device 220 can allow for improved thermal dissipation, as the thermal vias 106 are able to facilitate the transfer of heat away from the semiconductor device 220. In some embodiments, a thermal adhesive layer 304 may be disposed between the semiconductor device 220 and the antenna structure 120 to also facilitate heat transfer to the thermal vias 106. An embodiment antenna package 300 having a thermal adhesive layer 304 is shown in FIG. 10B. The thermal adhesive layer 304 may be formed on the semiconductor device 220 prior to or after placement on the redistribution structure 210. In some embodiments, the thermal adhesive layer 304 may be a material such as high thermal conductivity polymer films, silver pastes, thermal interface materials (TIM), graphene, the like, or a combination. The thermal adhesive layer 304 may have a thickness between about 5 µm and about 50 µm.

FIG. 10C shows an embodiment of an antenna package 300 in which the conductive pillar 214 protrudes from a bonding pad 215. A close-up view of an example bonding pad 215, conductive pillar 214, and connector 118 is also shown in FIG. 10C. The bonding pad 215 extends over the surface of the insulating layer 208, and may be formed as part of the redistribution layer 209. As described previously (see FIG. 10A), after placing a connector 118 made of a solder material on a conductive pillar 214, a reflow process may be performed. Due to wetting action during the reflow process, the solder material of the connector 118 may spread over the top surface of the bonding pad 215, which may cause the connector 118 to have a more vertical profile after the reflow process is completed. By controlling the dimensions of the bonding pad 215 and the conductive pillar 214, the profile shape of the connector 118 may be controlled. For example, the profile shape of the connector 118 may be controlled by e.g., an amount of material used for the connector 118, to be vertical, straight, tapered, convex, or another shape. In some embodiments, a height H1 of the conductive pillar 214 may be between about 3 µm and about 100 µm. In some embodiments, the height H2 of the connector 118 may be between about 80 µm and about 400 µm after reflow. The height H2 may be greater than the height H1. In some embodiments, the width D1 of the conductive pillar 214 may be between about 20 µm and about 200 µm. In some embodiments, the width D2 of the connector 118 may be between about 80 µm and about 250 µm after joining. The width D2 may be greater than the width D1. In some embodiments, the upper regions of the connector 118 may have a width D2' that is the same as a width D2 of lower regions of the connector 118, but in some cases the ratio between a width D2' and a width D2 may be between about 0.8 and about 1.2. The conductive pillar 214 or the connector 118 may include one layer or multiple layers of materials.

FIG. 11 illustrates a debonding of the carrier substrate 201 and a placement of external connections 306 to the antenna package 300. In an embodiment, the carrier substrate 201 may be debonded from the structure using, e.g., a thermal process to alter the adhesive properties of a release layer disposed on the carrier substrate 201. In a particular embodiment an energy source such as an ultraviolet (UV) laser, a carbon dioxide ($CO_2$) laser, or an infrared (IR) laser, is utilized to irradiate and heat the release layer until the release layer loses at least some of its adhesive properties. Once performed, the carrier substrate 201 and the release layer may be physically separated and removed from the structure.

The external connections 306 are formed or placed in electrical connection with the redistribution layer 203. In some embodiments, the external connections 306 may be a ball grid array (BGA) including a eutectic material such as solder, although any suitable materials may be used. In an embodiment, in which the external connections 306 are solder balls, the external connections 306 may be formed using a ball drop method, such as a direct ball drop process. In another embodiment, the solder balls may be formed by initially forming a layer of tin through any suitable method such as evaporation, electroplating, printing, solder transfer, and then performing a reflow in order to shape the material into the desired bump shape.

Once the external connections 306 have been formed or placed, the structure may be singulated into a discrete antenna package 300, as shown in Figure ii. In an embodiment, the structure may be singulated using one or more saw blades that separate the structure into discrete pieces. However, any suitable method of singulation, including laser ablation or one or more wet etches, may also be utilized.

By forming an antenna package 300 as described, multiple types of antennas can be integrated into a single package. For example, the antenna package 300 includes patch antennas 110 having a vertical directionality, end-fire antennas 112 having a lateral directionality, and dipole antennas 212 also having a lateral directionality. Through the use of multiple types of antennas, the directionality and beam-steering of the overall antenna package 300 may be improved. For example, by using both end-fire antennas 112 and dipole antennas 212, the range, shape, and strength of the lateral directionality can be increased. The use of multiple types of antennas can also allow for multiple-in/multiple-out (MIMO) antenna operation. In particular, the use of multiple types of antennas can allow for individual antennas having a smaller size or for antenna arrays having fewer elements, which can reduce the overall size of the antenna package. The use of multiple types of antennas as described can also allow for more flexibility in the size, shape, design, or arrangement of the antennas. In some cases, the improved design flexibility may allow for improved bandwidth or for improved frequency control of the antennas.

Figure 13:
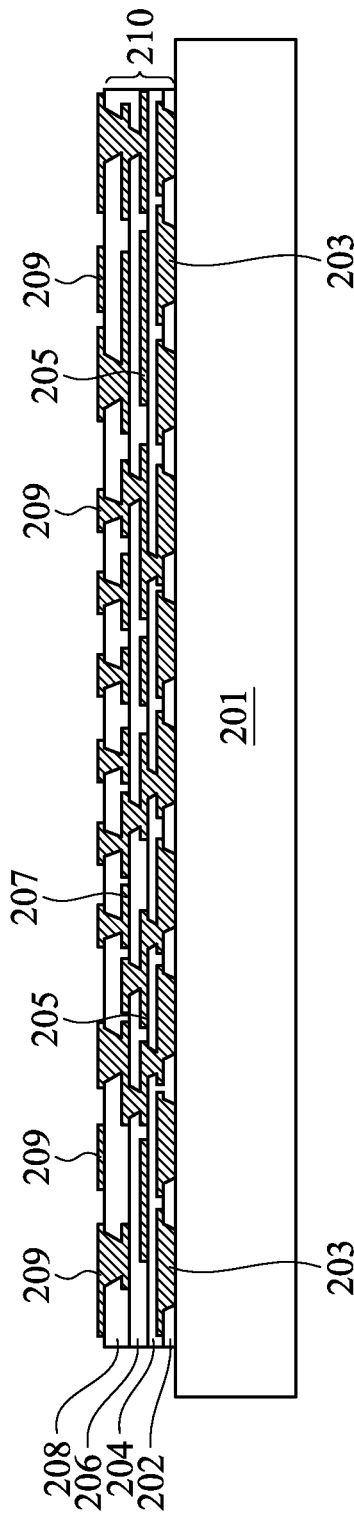
Figure 14:
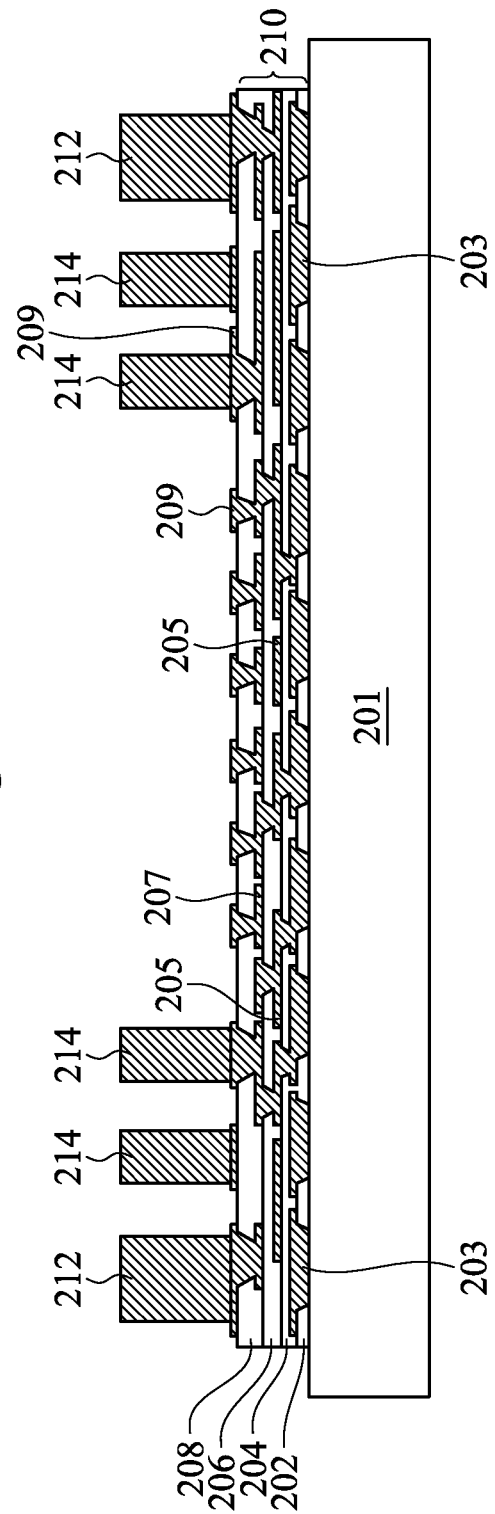
Figure 15:
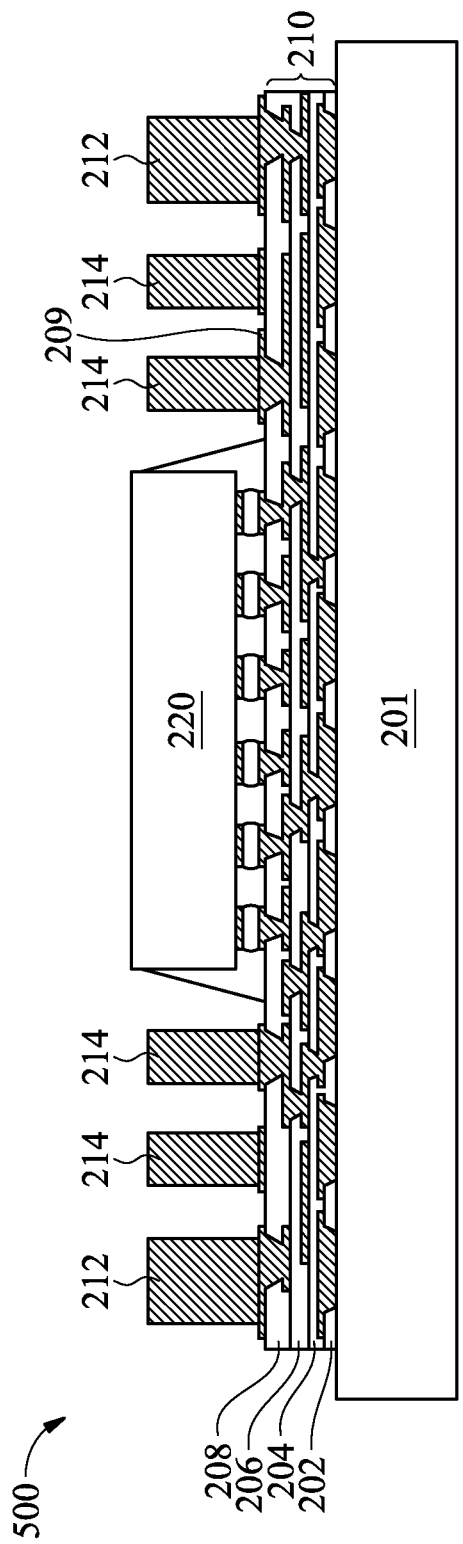
Figure 16:
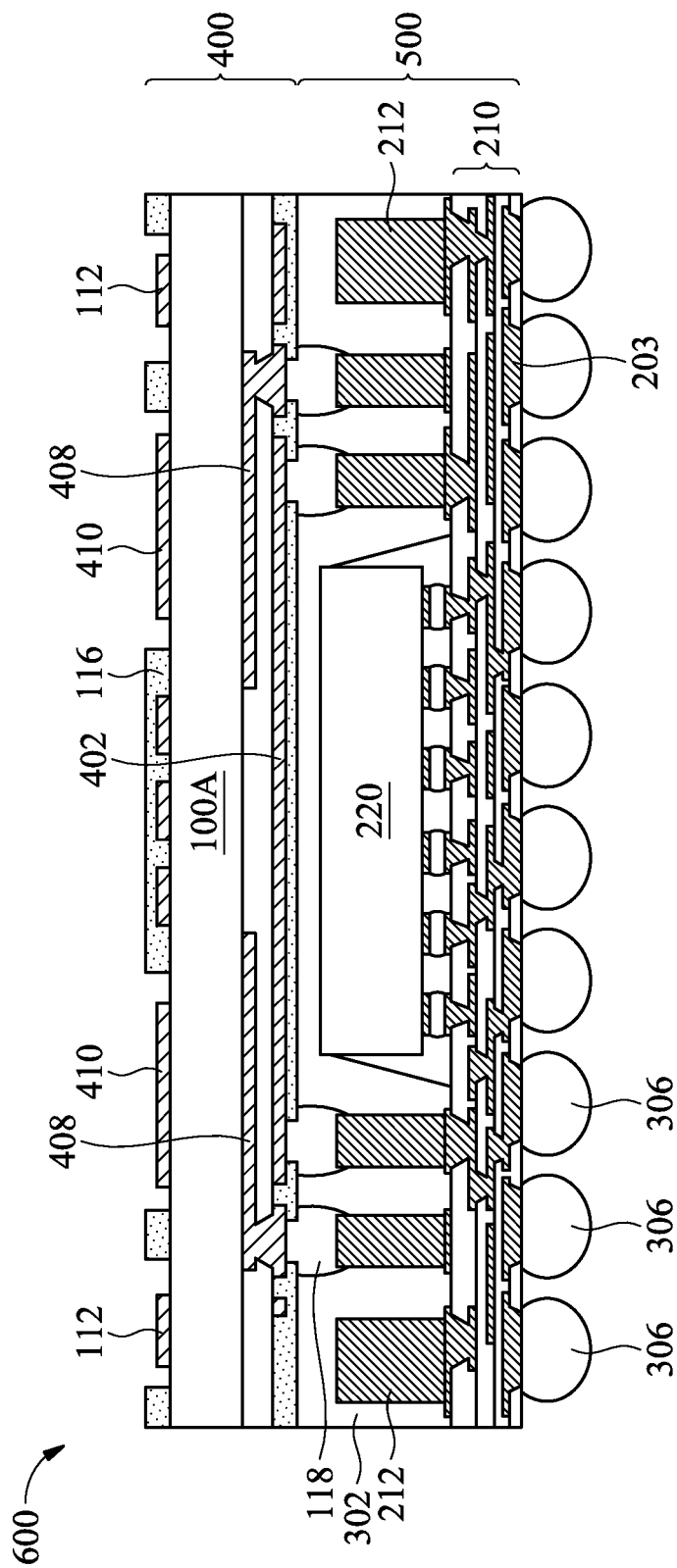

FIGS. 12 through 16 illustrate intermediate steps of forming an antenna package 600 (see FIG. 16), in accordance with some embodiments. FIG. 12 illustrates a cross-sectional view an antenna structure 400, in accordance with some embodiments. FIGS. 13-15 illustrate cross-sectional views of intermediate steps of forming a device structure 500, in accordance with some embodiments. FIG. 16 illustrates a cross-sectional view an antenna package 600, in accordance with some embodiments.

FIG. 12 illustrates an antenna structure 400, in accordance with some embodiments. The antenna structure 400 may be similar to the antenna structure 120 described previously with respect to FIGS. 1-5, except that the antenna structure 400 is a multi-level structure, and that no thermal vias are present. In some embodiments, the antenna structure 400 may be formed in a manner similar to that described for antenna structure 120 in FIGS. 1-5. For example, the antenna structure 400 may be formed from a core substrate that includes a first insulation substrate 100A having conductive layers disposed on opposite surfaces, which may be similar to conductive layers 102 (see FIG. 1). The conductive material may be deposited in a manner similar to that described with respect to FIGS. 2 and 3A.

A second insulation substrate 100B having a conductive layer on a surface may then be attached to the first insulation substrate 100A, the conductive layer facing away from the first insulation substrate 100A. The first insulation substrate 100A or the second insulation substrate 100B may be similar to the insulation substrate 100 described in FIG. 1. After attaching the second insulation substrate 100B, openings may be formed in the second insulation substrate 100B to expose the conductive material on the first insulation substrate 100A. Then, conductive material may be deposited having a pattern on the second insulation substrate 100B, similar to FIGS. 2 and 3A. Connectors 118 are attached to the conductive material, and may be similar to connectors 118 described in FIG. 5 and may be formed in a similar manner. A protective layer 116 similar to protective layer 116 may also be formed, and other steps such a solderability treatment may also be performed as described previously.

In this manner, a multilayer antenna structure 400 may be formed from insulation substrates, and an example of a three-layer structure is shown in FIG. 12. In some embodiments, additional insulation substrates and conductive material may be used to form a multilayer antenna structure 400 having another number of layers such as 4 or more layers. As shown in FIG. 12, the antenna structure 400 includes end-fire antennas 112 formed on a top surface of the first insulation substrate 100A. The end-fire antennas 112 may be similar to the end-fire antennas 112 described previously (see FIGS. 3A-B). The antenna structure 400 also includes parasitic patch antennas 410 and directly-driven patch antennas 408 that are electrically connected to feedline vias 409. The patch antennas 408/410 or feedline vias 409 may be similar to those described previously (see FIGS. 3A-B). In other embodiments, the feedline vias 409 are electrically connected to conductive features and the patch antennas 408 are driven directly through the electrical connection. Any suitable combination of parasitic patch antennas 410 and directly-driven patch antennas 408 may be used.

The multilayer antenna structure 400 shown in FIG. 12 includes conductive routing, which may be formed in any layer of conductive material. The multilayer antenna structure 400 also includes a groundplane 402 formed on the bottom surface of the second insulation substrate 100B and connected to external connectors 118. The groundplane 402 may be, for example, the groundplane associated with the patch antennas 408. FIG. 12 shows the antenna structure having a single groundplane 402, but in other embodiments, two or more groundplanes 402 may be formed. In some embodiments, the groundplane 402 may be connected to one external connector 118 or more than two external connectors 118. In some embodiments, the groundplane 402 may have a lateral dimension (length or width) between about 3 mm and about 15 mm.

Turning to FIGS. 13-15, a device structure 500 is formed according to some embodiments. In FIG. 13, a redistribution structure 210 is formed over a carrier substrate 201. The redistribution structure 210 may be formed in a manner similar to that described previously with regard to FIGS. 6A-7. For example, the redistribution structure 210 may be formed from a series of seed layers and plating processes which are used to build up successive layers of redistribution layers and insulating layers. In some embodiments, the redistribution structure 210 described with respect to FIGS. 13-16 may have fewer layers than the redistribution structure 210 described with respect to FIGS. 6A-7. For example, the redistribution structure 210 shown in FIGS. 13-16 may have two redistribution layers or three redistribution layers instead of the four redistribution layers shown.

In FIG. 14, dipole antennas 212 and conductive pillars 214 are formed over and connected to the redistribution structure 210. The dipole antennas 212 and conductive pillars 214 may be similar to those described previously with respect to FIGS. 8A-B, and may be formed in a similar manner. For example, a photoresist may be formed over the redistribution structure 210 and patterned where the dipole antennas 212 and the conductive pillars 214 are desired to be formed, and a conductive material deposited onto the exposed portions of the redistribution structure 210. Once formed, the photoresist and excess conductive material may be removed.

In FIG. 15, a semiconductor device 220 is connected to the redistribution structure 210. The semiconductor device 220 may be one or more semiconductor devices 220 similar to those described previously with respect to FIGS. 9A-B, and may be connected to the redistribution structure 210 in a similar manner. The semiconductor device 220 may have a height above the redistribution structure 210 that is lower than, about the same, or higher than a height of the dipole antennas 212 or conductive pillars 214.

Turning to FIG. 16, an antenna package 600 is formed by bonding the antenna structure 400 to the device structure 500, and a molding material 302 is formed between the antenna structure 400 and the device structure 500. The antenna structure 400 may be bonded to the device structure 500 in a manner similar to that previously described for FIGS. 10A-C. For example, the connectors 118 of the antenna structure 400 may be placed on the conductive pillars 214 of the device structure 500, and then a reflow process may be performed. A molding material 302 may then be formed, which may be similar to the molding material 302 described previously for FIGS. 10A-C.

In an embodiment, the carrier substrate 201 may be debonded from the structure using, e.g., a thermal process to alter the adhesive properties of a release layer disposed on the carrier substrate 201. In a particular embodiment an energy source such as an ultraviolet (UV) laser, a carbon dioxide ($CO_2$) laser, or an infrared (IR) laser, is utilized to irradiate and heat the release layer until the release layer loses at least some of its adhesive properties. Once performed, the carrier substrate 201 and the release layer may be physically separated and removed from the structure. External connections 306 may then be formed or placed in electrical connection with the redistribution structure 210. The external connections 306 may be similar to the external connections 306 described previously with respect to FIG. 11.

By having an antenna package 600 with a groundplane 402 formed in a multilayer antenna structure 400 as shown in FIG. 16, performance of the antenna package 600 may be improved. For example, a single large groundplane or a groundplane connected to the device structure 500 by multiple connectors 118 (e.g., a groundplane similar to groundplane 402 shown in FIG. 16) may have more stable electrical performance or provide stronger grounding for the patch antennas 408/410. In this manner, the performance of the patch antennas 410 may also be improved. In some embodiments, the use of a multilayer antenna structure 400 may allow for more routing to be formed in the antenna structure 400, and thus less routing (e.g., redistribution layers) may be formed in the redistribution structure 210. By forming more of the routing in the antenna structure 400, the cost of the antenna package 600 may be reduced.

Figure 17:
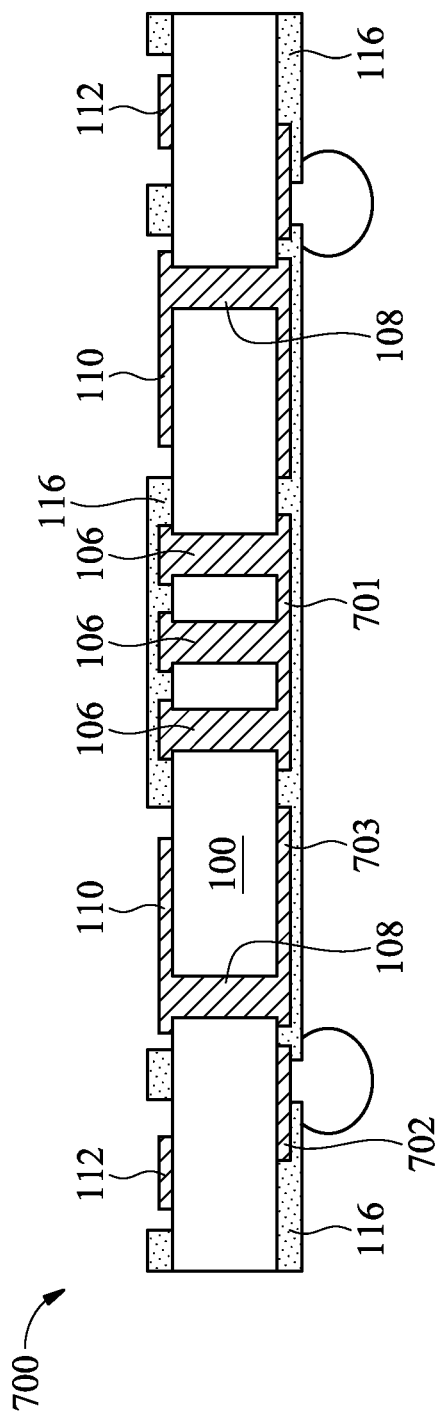
FIGS. 17 through 21 illustrate cross-sectional views of intermediate steps of forming an antenna package, in accordance with some embodiments.
Figure 18:
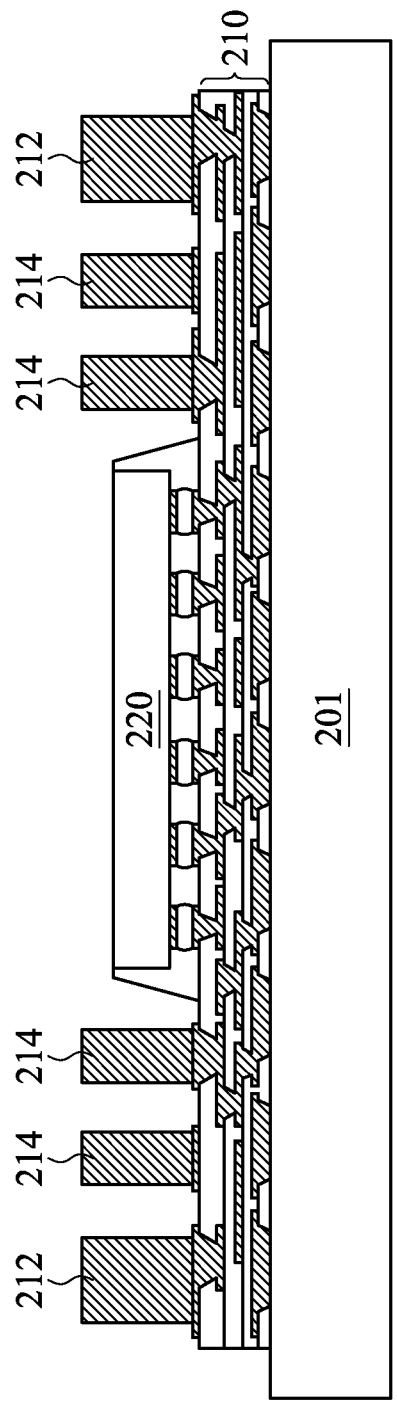
Figure 19:
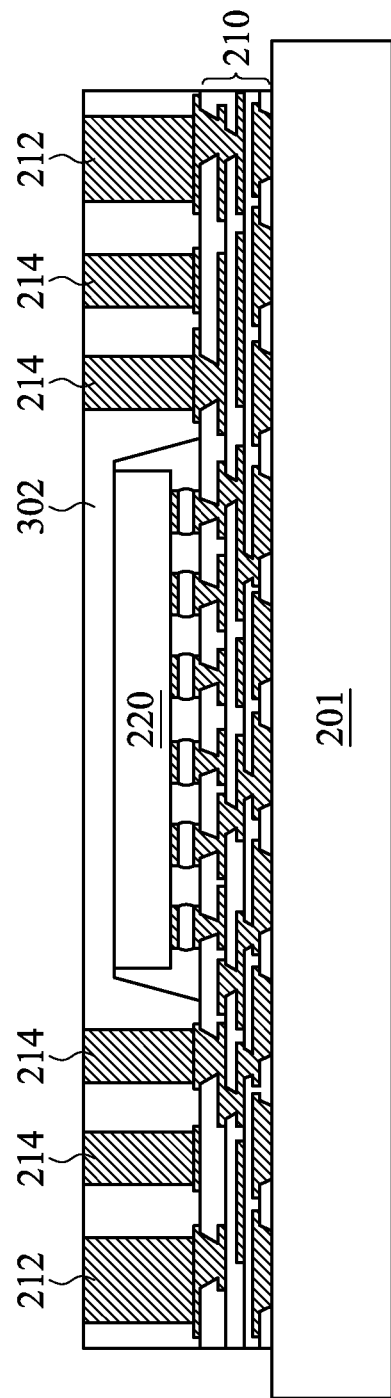
Figure 20:
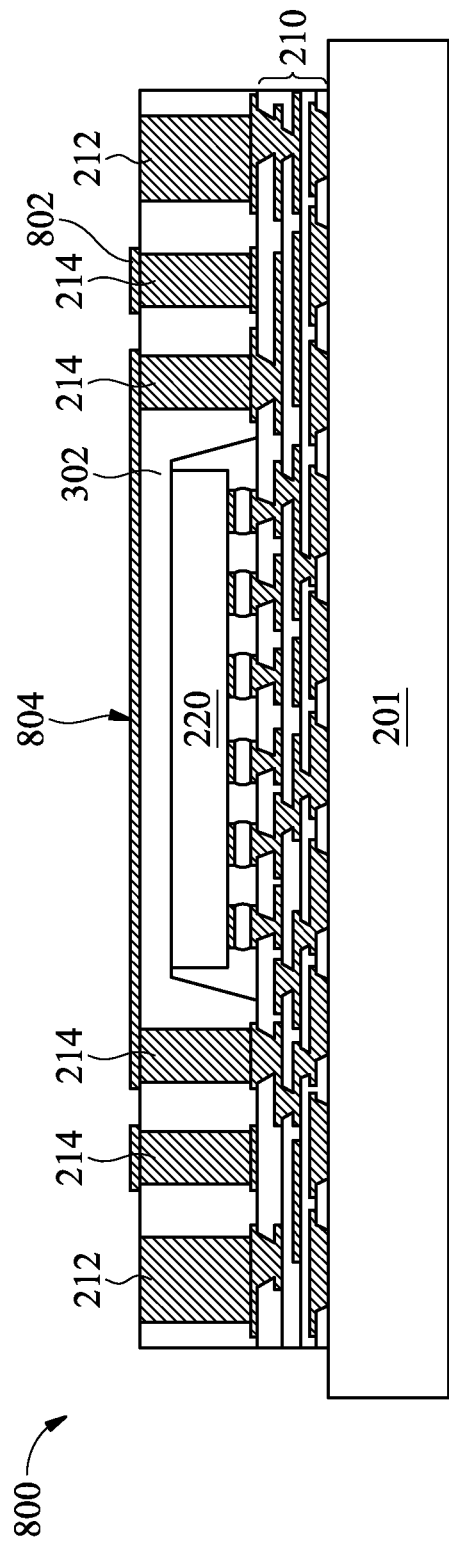
Figure 21:
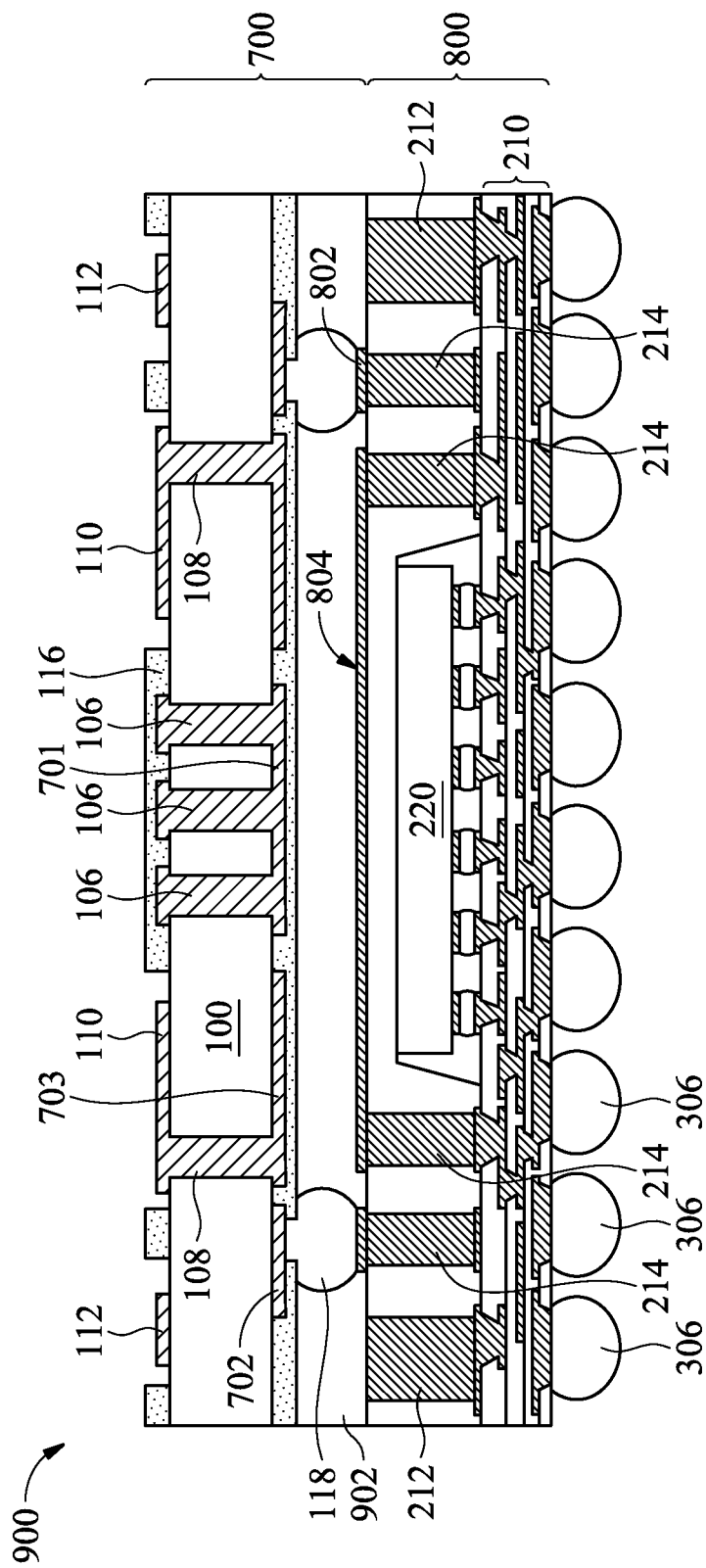

FIGS. 17 through 21 illustrate intermediate steps of forming an antenna package 900 (see FIG. 21), in accordance with some embodiments. FIG. 17 illustrates a cross-sectional view of an antenna structure 700, in accordance with some embodiments. FIGS. 18-20 illustrate cross-sectional views of intermediate steps of forming a device structure 800 (see FIG. 20), in accordance with some embodiments. FIG. 21 illustrates a cross-sectional view of the antenna package 900, in accordance with some embodiments.

FIG. 17 illustrates an antenna structure 700, in accordance with some embodiments. The antenna structure 700 may be similar to the antenna structure 120 described previously with respect to FIGS. 1-5, except that the thermal vias 106 are connected by a conductive layer 701. In some embodiments, the antenna structure 700 may be formed in a manner similar to that described for antenna structure 120 in FIGS. 1-5. For example, the antenna structure 700 may be formed from a core substrate that includes an insulation substrate 100 having conductive layers disposed on opposite surfaces, which may be similar to conductive layers 102 (see FIG. 1). Openings may be formed through the insulation substrate 100, and then conductive material may be deposited having a pattern to form through-via structures (e.g. feedline vias 108 or thermal vias 106) or other conductive features such as antennas (e.g., patch antennas 110 or end-fire antennas 112), features such as parasitic elements 703 or conductive elements 702 (described below), or other features such as groundplanes, routing, etc. The conductive material may be deposited in a manner similar to that described with respect to FIGS. 2 and 3A. The patch antennas 110, end-fire antennas 112, feedline vias 108, and thermal vias 106 may be similar to those described previously (see FIGS. 3A-B). Connectors 118 are attached to the conductive material on the bottom surface of the insulation substrate 100, and may be similar to connectors 118 described in FIG. 5 and may be formed in a similar manner. In some embodiments, the connectors 118 are electrically connected to conductive elements 702, and the conductive elements 702 are directly driven by signals conducted through the connectors 118. In some embodiments, parasitic patch antennas 110 may be connected by feedline vias 108 to parasitic elements 703 disposed on the opposite side of the insulation substrate 100 from the patch antennas 110. The parasitic elements 703 may be parasitically driven by the conductive elements 702, which also parasitically drives the patch antennas 110 through the feedline vias 108. A protective layer 116 similar to protective layer 116 may also be formed, and other steps such a solderability treatment may also be performed as described previously.

Turning to FIGS. 18-20, a device structure 800 (see FIG. 20) is formed according to some embodiments. In FIG. 18, a redistribution structure 210 is formed over a carrier substrate 201. The redistribution structure 210 may be formed in a manner similar to that described previously with regard to FIGS. 6A-7. For example, the redistribution structure 210 may be formed from a series of seed layers and plating processes which are used to build up successive layers of redistribution layers and insulating layers. In some embodiments, the redistribution structure 210 described with respect to FIGS. 18-21 may have fewer layers than the redistribution structure 210 described with respect to FIGS. 6A-7. For example, the redistribution structure 210 shown in FIGS. 18-21 may have two redistribution layers or three redistribution layers instead of the four redistribution layers shown.

Also shown in FIG. 18, dipole antennas 212 and conductive pillars 214 are formed over and connected to the redistribution structure 210. The dipole antennas 212 and conductive pillars 214 may be similar to those described previously with respect to FIGS. 8A-B, and may be formed in a similar manner. For example, a photoresist may be formed over the redistribution structure 210 and patterned where the dipole antennas 212 and the conductive pillars 214 are desired to be formed, and a conductive material deposited onto the exposed portions of the redistribution structure 210. Once formed, the photoresist and excess conductive material may be removed. A semiconductor device 220 is then connected to the redistribution structure 210. The semiconductor device 220 may be one or more semiconductor devices 220 similar to those described previously with respect to FIGS. 9A-B, and may be connected to the redistribution structure 210 in a similar manner. The semiconductor device 220 may have a height above the redistribution structure 210 that is lower than or about the same as a height of the dipole antennas 212 or conductive pillars 214.

Turning to FIG. 19, a molding material 302 is formed over the redistribution structure 210, the dipole antennas 212, the conductive pillars 214, and the semiconductor device 220. The molding material 302 may be similar to the molding material 302 described previously for FIGS. 10A-C. After forming the molding material 302, a planarization process (e.g., a CMP process) may be performed. The planarization process may expose top surfaces of the dipole antennas 212, conductive pillars 214, or semiconductor device 220. In some embodiments, a thermal adhesive (not shown in FIG. 19) similar to the thermal adhesive 304 (see FIG. 10B) may be formed over the semiconductor device 220 prior to formation of the molding material 302.

In FIG. 20, a patterned conductive layer is formed over the molding material 302 and the conductive pillars 214, forming bonding pads 802, groundplane 804, routing, or other conductive features. In an embodiment, a photoresist layer is formed over the structure and then patterned to expose portions of the conductive pillars 214 and molding material 302 over which the conductive material is to be formed. The conductive material may then be deposited using a process such as CVD, PVD, plating, or the like. In some embodiments, the conductive material may be copper, titanium, tungsten, aluminum, another metal, a combination, or the like. After the conductive material has been deposited, the photoresist and excess conductive material may be removed using a wet chemical process and/or a dry process (e.g., an ashing process). In some embodiments, the conductive material may be formed having a thickness between about 5 µm and about 20 µm In this manner, a device structure 800 may be formed.

As shown in FIG. 20, the conductive material may be formed over conductive pillars 214 to form bonding pads 802, used for subsequent bonding to the connectors 118 of the antenna structure 700 (see FIG. 21). One or more groundplanes 804 may also be formed from the conductive material, portions of which may be formed over and connected to conductive pillars 214. In some embodiments, the groundplane 804 may have a lateral dimension (length or width) between about 3 mm and about 15 mm. As shown in FIG. 20, the groundplane 804 may be formed extending over the semiconductor device 220. The groundplane 804 is shown connected to two conductive pillars 214, but in other embodiments the groundplane may be connected to one conductive pillar 214 or more than two conductive pillars 214.

Turning to FIG. 21, an antenna package 900 is formed by bonding the antenna structure 700 to the device structure 800, and a molding material 902 is formed between the antenna structure 700 and the device structure 800. The antenna structure 700 may be bonded to the device structure 800 in a manner similar to that previously described for FIGS. 10A-C. For example, the connectors 118 of the antenna structure 700 may be placed on the bonding pads 802 of the device structure 800, and then a reflow process may be performed. A molding material 902 may then be formed, which may be similar to the molding material 302 described previously for FIGS. 10A-C, and which may be formed in a similar manner.

By forming the groundplane 804 as part of the device structure 800 instead of as part of the antenna structure 700, more space in the antenna structure 700 may be available for forming additional routing, antennas, or other conductive features. In some embodiments, more routing formed in the antenna structure 700 may allow for fewer redistribution layers to be formed in the redistribution structure 210. More available space for conductive features may also allow greater design flexibility for the routing, antennas, etc. For example, dipole antennas 212, patch antennas 110, or end-fire antennas 112 may be formed having larger sizes, or additional dipole antennas 212, patch antennas 110, or end-fire antennas 112 may be formed. In some embodiments, an additional groundplane may be formed in the antenna structure (e.g., groundplane 114 shown in FIG. 3A or groundplane 402 shown in FIG. 12, or the like) to provide improved electrical performance and more stable antenna operation.

Figure 22:
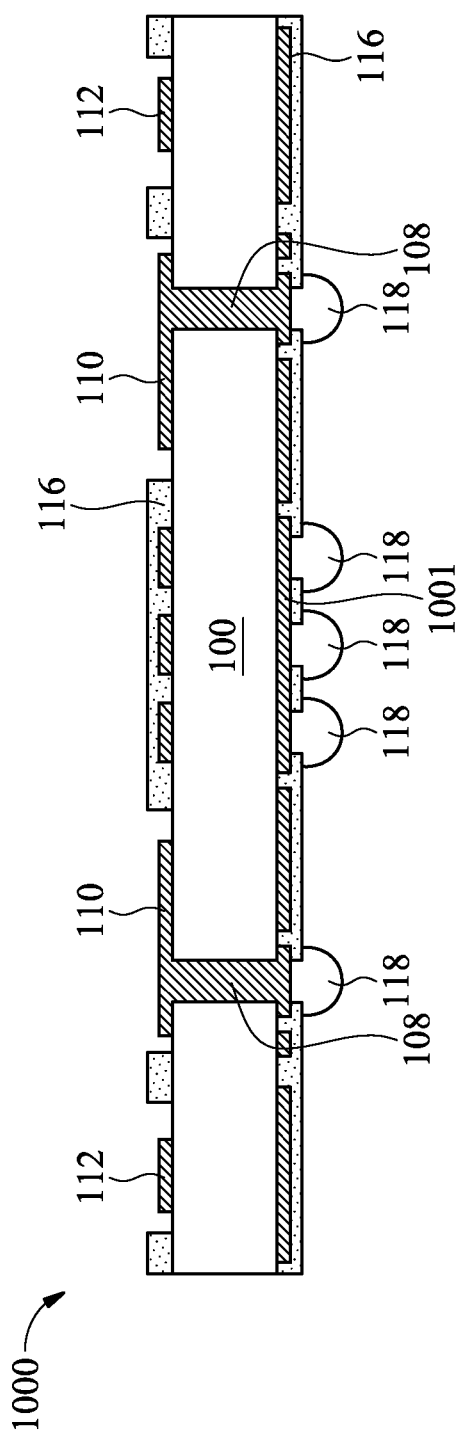
FIGS. 22 through 24 illustrate cross-sectional views of intermediate steps of forming an antenna package, in accordance with some embodiments.
Figure 23:
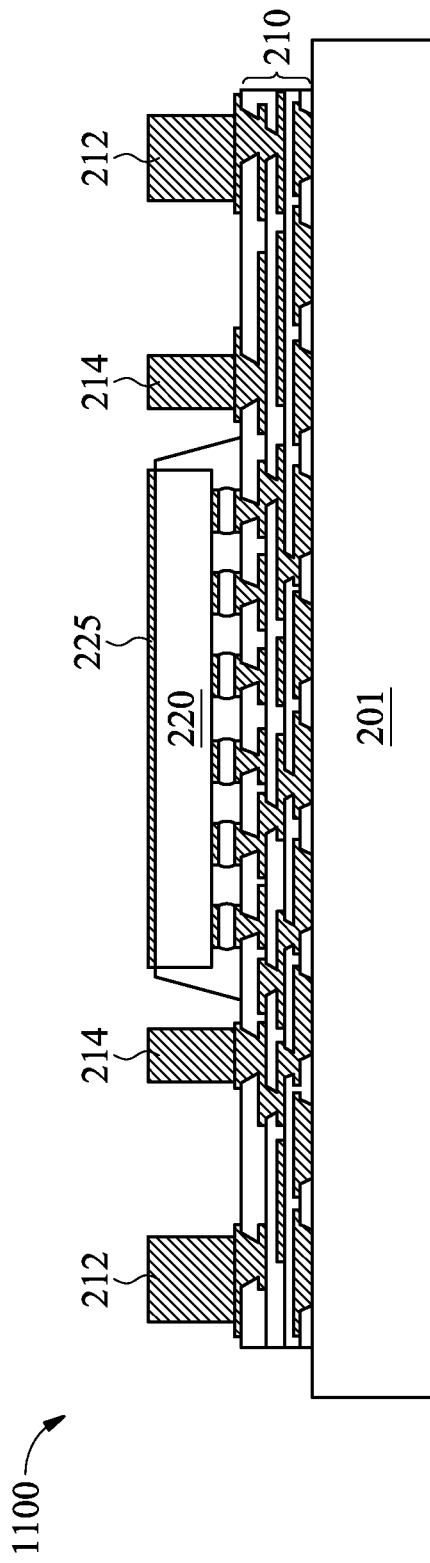
Figure 24:
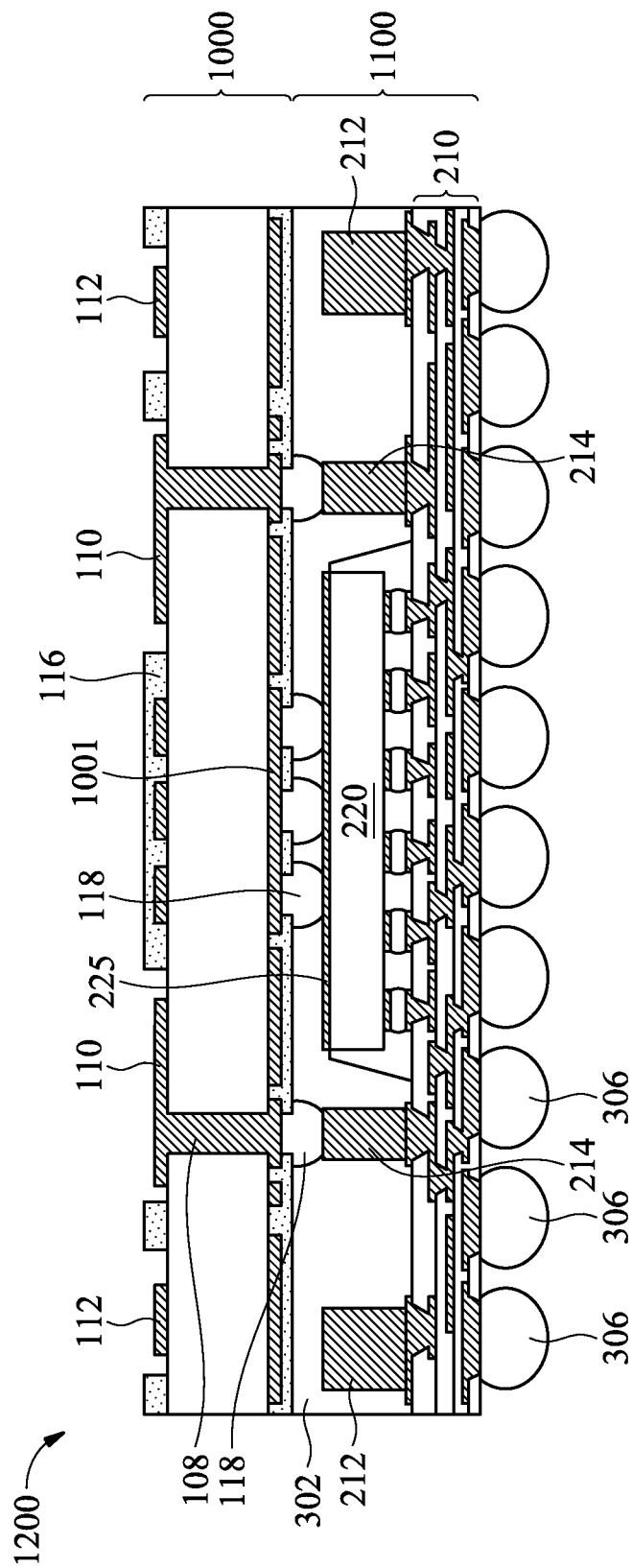

FIGS. 22 through 24 illustrate intermediate steps of forming an antenna package 1200 (see FIG. 24), in accordance with some embodiments. FIG. 22 illustrates a cross-sectional view an antenna structure 1000, in accordance with some embodiments. FIG. 23 illustrates a cross-sectional view of a device structure 1100, in accordance with some embodiments. FIG. 24 illustrates a cross-sectional view an antenna package 1200, in accordance with some embodiments.

FIG. 22 illustrates an antenna structure 1000, in accordance with some embodiments. The antenna structure 1000 may be similar to the antenna structure 120 described previously with respect to FIGS. 1-5, except a groundplane 1001 is connected to multiple connectors 118. In other embodiments, more than one groundplane 1001 may be formed, and the groundplane 1001 may be connected to any number of connectors 118. In some embodiments, the antenna structure 1000 may be formed in a manner similar to that described for antenna structure 120 in FIGS. 1-5. For example, the antenna structure 1000 may be formed from a core substrate that includes an insulation substrate 100 having conductive layers disposed on opposite surfaces, which may be similar to conductive layers 102 (see FIG. 1). Openings may be formed through the insulation substrate 100, and then conductive material may be deposited having a pattern to form through-via structures (e.g. feedline vias 108) or other conductive features such as antennas (e.g., patch antennas 110 or end-fire antennas 112), groundplanes 1001, routing, etc. The conductive material may be deposited in a manner similar to that described with respect to FIGS. 2 and 3A. The patch antennas 110, end-fire antennas 112, and feedline vias 108 may be similar to those described previously (see FIGS. 3A-B). Connectors 118 are attached to the conductive material (e.g., the feedline vias 108 and groundplane 1001) on the bottom surface of the insulation substrate 100, and may be similar to connectors 118 described in FIG. 5 and may be formed in a similar manner. A protective layer 116 similar to protective layer 116 may also be formed, and other steps such a solderability treatment may also be performed as described previously.

Turning to FIGS. 23, a device structure 1100 is formed according to some embodiments. A redistribution structure 210 is formed over a carrier substrate 201. The redistribution structure 210 may be formed in a manner similar to that described previously with regard to FIGS. 6A-7. For example, the redistribution structure 210 may be formed from a series of seed layers and plating processes which are used to build up successive layers of redistribution layers and insulating layers. In some embodiments, the redistribution structure 210 described with respect to FIG. 23 may have fewer layers than the redistribution structure 210 described with respect to FIGS. 6A-7. For example, the redistribution structure 210 shown in FIG. 23 may have two redistribution layers or three redistribution layers instead of the four redistribution layers shown.

Also shown in FIG. 23, dipole antennas 212 and conductive pillars 214 are formed over and connected to the redistribution structure 210. The dipole antennas 212 and conductive pillars 214 may be similar to those described previously with respect to FIGS. 8A-B, and may be formed in a similar manner. For example, a photoresist may be formed over the redistribution structure 210 and patterned where the dipole antennas 212 and the conductive pillars 214 are desired to be formed, and a conductive material deposited onto the exposed portions of the redistribution structure 210. Once formed, the photoresist and excess conductive material may be removed.

A semiconductor device 220 is then connected to the redistribution structure 210. The semiconductor device 220 may be connected to the redistribution structure 210 in a similar manner as described previously with respect to FIGS. 9A-B. The semiconductor device 220 may have a height above the redistribution structure 210 that is lower than, about the same, or higher than a height of the dipole antennas 212 or conductive pillars 214.

The semiconductor device 220 may be one or more semiconductor devices 220 similar to those described previously with respect to FIGS. 9A-B, except that the semiconductor device 220 shown in FIG. 23 has a conductive layer 225 formed on its top surface. In some embodiments, the conductive layer 225 is formed on the semiconductor device 220 prior to connecting the semiconductor device 220 to the redistribution structure 210. The conductive layer 225 may be deposited using a process such as CVD, PVD, plating, or the like. In some embodiments, the conductive layer 225 may be copper, titanium, tungsten, aluminum, another metal, a combination, or the like. In some embodiments, the conductive layer 225 is formed having a thickness between about 3 μm and about 20 μm. In some embodiments, the conductive layer 225 is electrically connected to the semiconductor device 220.

Turning to FIG. 24, an antenna package 1200 is formed by bonding the antenna structure 1000 to the device structure 1100, and a molding material 302 is formed between the antenna structure 1000 and the device structure 1100. The antenna structure 1000 may be bonded to the device structure 1100 in a manner similar to that previously described for FIGS. 10A-C. For example, the connectors 118 of the antenna structure 700 may be placed on conductive pillars 214 of the device structure 1000. As shown in FIG. 24, connectors 118 are also placed on the conductive layer 225 of the semiconductor device 220 to electrically connect the groundplane 1001 to the conductive layer 225. A reflow process may be performed. A molding material 302 may then be formed, which may be similar to the molding material 302 described previously for FIGS. 10A-C, and which may be formed in a similar manner.

By connecting the groundplane 1001 to the conductive layer 225 of the semiconductor device 220, the conductive layer 225 may act as a groundplane in addition to groundplane 1001. Due to the grounding of the conductive layer 225 in this manner, the size of the groundplane 1001 may be reduced. In some embodiments, the groundplane 1001 may be electrically connected to the redistribution structure 210 through conductive pillars 214.

By reducing the size of the groundplane 1001 or forming fewer conductive pillars 214, more space in the antenna structure 1000 may be available for forming additional routing, antennas, or other conductive features. In some embodiments, more routing formed in the antenna structure 1000 may allow for fewer redistribution layers to be formed in the redistribution structure 210. More available space for conductive features may also allow greater design flexibility for the routing, antennas, etc. For example, dipole antennas 212, patch antennas 110, or end-fire antennas 112 may be formed having larger sizes, or additional dipole antennas 212, patch antennas 110, or end-fire antennas 112 may be formed.

Figure 25:
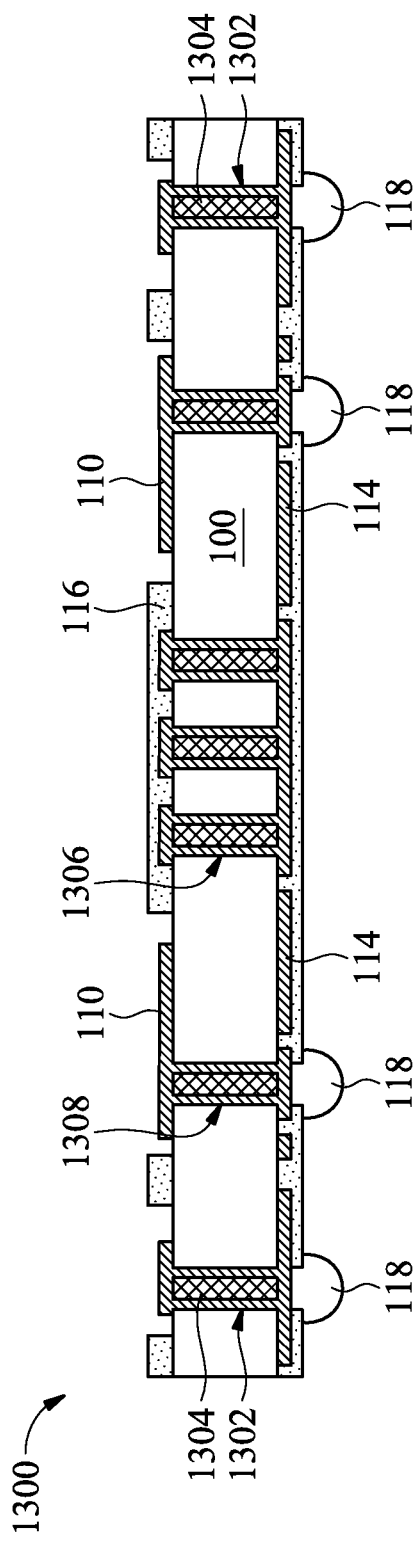
FIGS. 25 through 30 illustrate cross-sectional views of intermediate steps of forming an antenna package, in accordance with some embodiments.
Figure 26:
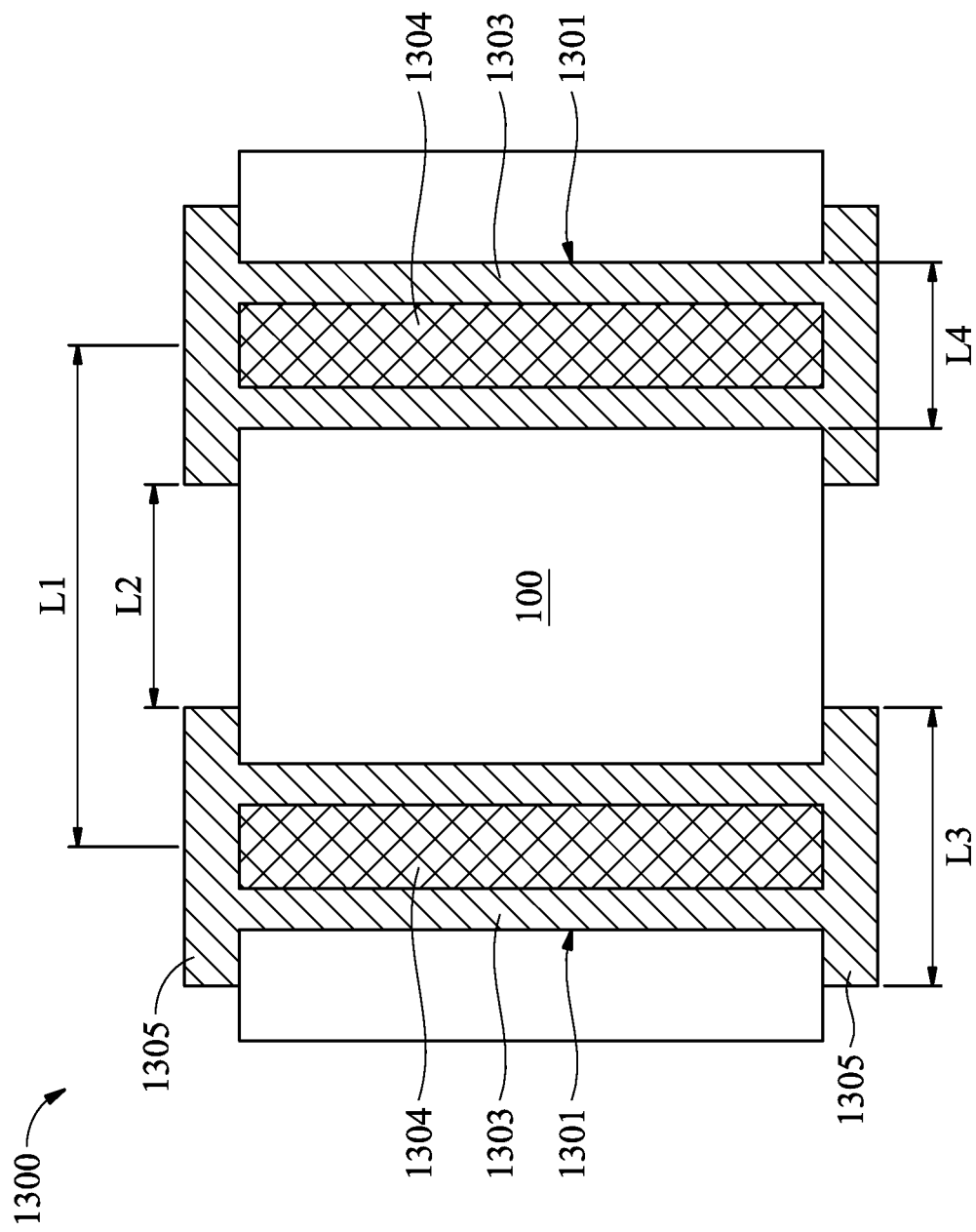
Figure 27:
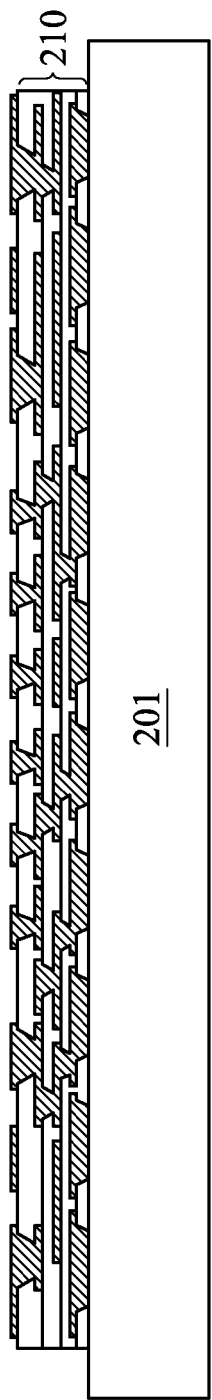
Figure 28:
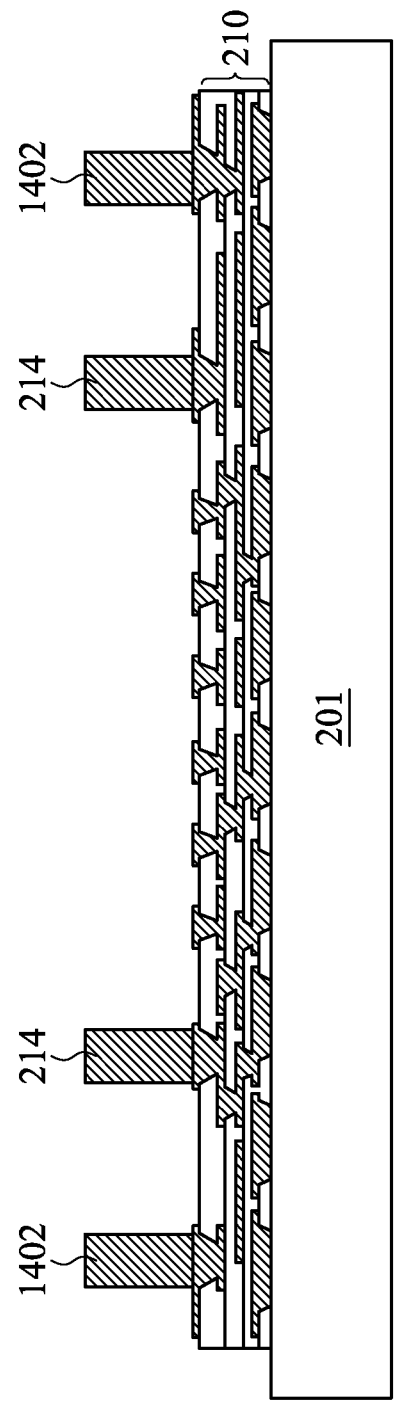
Figure 29:
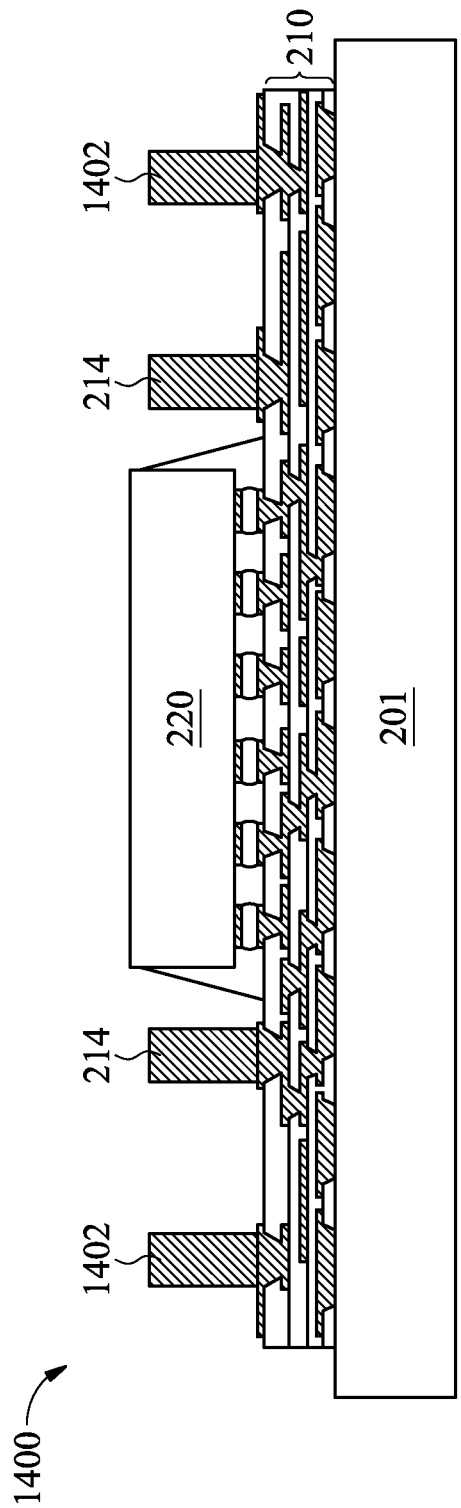
Figure 30:
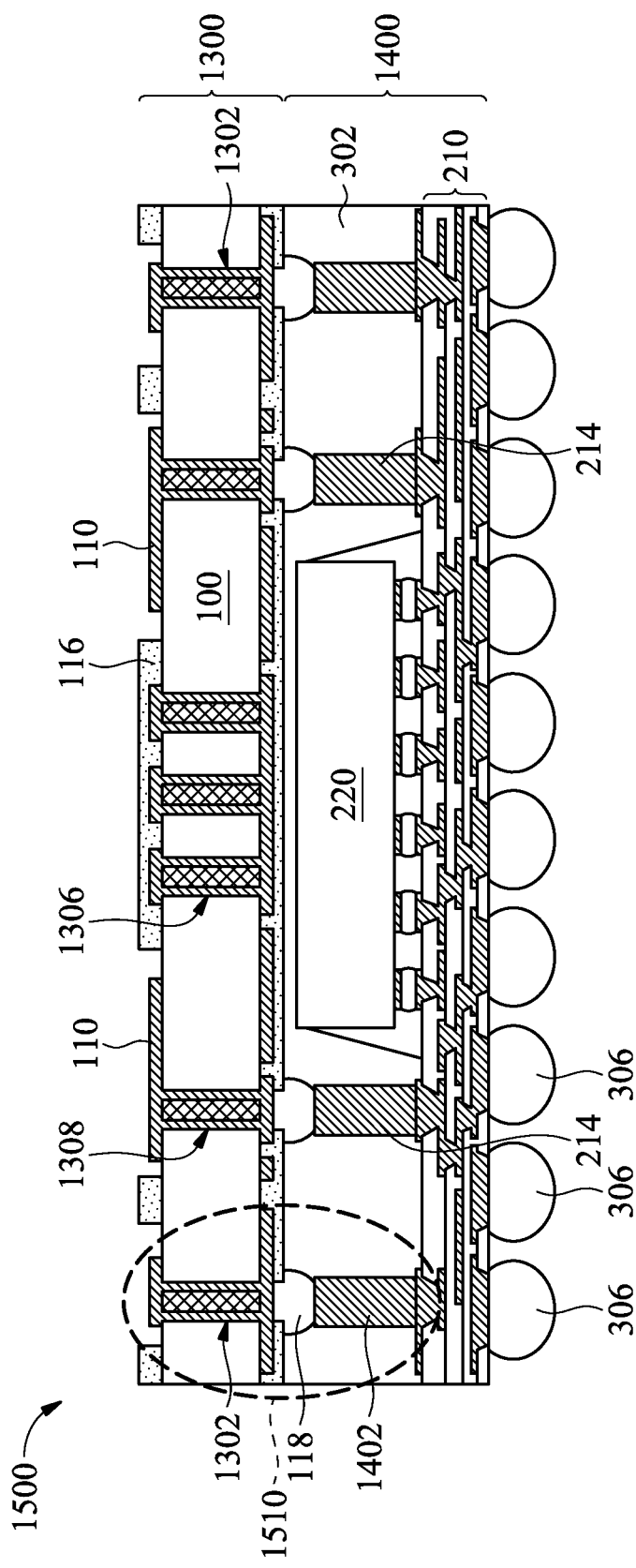

FIGS. 25 through 30 illustrate intermediate steps of forming an antenna package 1500 (see FIG. 30) having sidewall antennas 1510, in accordance with some embodiments. FIGS. 25 and 26 illustrate cross-sectional views of an antenna structure 1300, in accordance with some embodiments. FIGS. 27-29 illustrate cross-sectional views of intermediate steps of forming a device structure 1400, in accordance with some embodiments. FIG. 30 illustrates a cross-sectional view an antenna package 1500, in accordance with some embodiments.

FIG. 25 illustrates an antenna structure 1300, in accordance with some embodiments. The antenna structure 1300 may be similar to the antenna structure 120 described previously with respect to FIGS. 1-5, except that through-via structures are formed having an interior dielectric material 1304 (described in greater detail below). In some embodiments, the antenna structure 1300 may be formed in a manner similar to that described for antenna structure 120 in FIGS. 1-5. For example, the antenna structure 1300 may be formed from a core substrate that includes an insulation substrate 100 having conductive layers disposed on opposite surfaces, which may be similar to conductive layers 102 (see FIG. 1). Openings may be formed through the insulation substrate 100 using e.g., a laser drilling process. Through-via structures are subsequently formed within the openings (e.g., upper sidewall antennas 1302, feedline vias 1308, or thermal vias 1306, described below). In some embodiments, the openings have a width between about 80 µm and about 300 µm, such as about 100 µm. In some embodiments, the height:width aspect ratio of the openings is between about 3:1 and about 9:1, such as about 5:1. The openings may have the same width or aspect ratio or have different widths or aspect ratios. The height of the openings may correspond to the thickness of the insulation substrate 100. The openings may have a rectangular shape, a circular shape, or another shape.

In some embodiments, a patterned mask (e.g., a patterned photoresist layer) is then formed over a first side of the insulation substrate 100, in which openings in the patterned mask correspond to regions on which conductive material will subsequently be formed. The openings in the patterned mask also may expose the openings in the insulation substrate 100. The conductive material may then be deposited on the insulation substrate 100 and within the openings using, for example, a plating process, an electroless plating process, or another process. In some embodiments, the conductive material is deposited having a thickness between about 3 µm and about 50 µm, such as about 10 µm. The conductive material may be, for example, copper or the like. In this manner, conductive features and through-via structures may be formed. The conductive features may include, for example, patch antennas 110, end-fire antennas 112, other types of driven antennas, parasitic antennas, or arrays of antennas. The conductive features may also include groundplanes 114 or other conductive features (e.g., pads, routing, traces, or conductive lines).

In some embodiments, a larger height:width aspect ratio of the openings in the insulation substrate 100 may result in the openings being incompletely filled with the conductive material. In some cases, conductive material deposited on the sidewalls of the openings may not merge to fill the interior region of the opening. As an example, for copper plated to a thickness of about 10 um on the sidewalls of an opening having about a 500 µm:100 µm height:width aspect ratio, a void may remain extending through the interior region of the opening. Other examples are possible and considered within the scope of this disclosure. In some embodiments, after forming the conductive material, the openings may then be filled with a dielectric material 1304. The dielectric material 1304 may provide protection for the conductive material and structural support for the antenna structure 1300. In some embodiments, the dielectric material 1304 may be a material such as a resin, solder mask, or another material. The dielectric material 1304 may be formed using, e.g., a spin-on process or another process.

In this manner, through-via structures may be formed in the antenna structure 1300. As shown in FIG. 25, the through-via structures may include feedline vias 1308, thermal vias 1306, and upper sidewall antennas 1302. The feedline vias 1308 may be similar in function to the feedline vias 108 described previously with respect to FIG. 3A. For example, the feedline vias 1308 may be connected to patch antennas 110 and the patch antennas 110 may be driven through the feedline vias 1308 (either directly driven or parasitically driven). The thermal vias 1306 may be similar in function to the thermal vias 106 described previously with respect to FIG. 3A. For example, the thermal vias 1306 may be configured to transfer heat from a semiconductor device 220 (see FIG. 30). The upper sidewall antennas 1302 are upper portions of sidewall antennas 1510 formed in the antenna package 1500, described below with respect to FIG. 30. The feedline vias 1308, thermal vias 1306, or upper sidewall antennas 1302 may have similar widths or may have different widths.

Turning to FIG. 26, a representative close-up view of through-via structures 1301 are shown. The through-via structures 1301 may be feedline vias 1308, thermal vias 1306, or upper sidewall antennas 1302. The through-via structures 1301 include dielectric material 1304 surrounded by conductive material 1303. The conductive material 1303 may be a material such as copper or the like, as described above. As shown in FIG. 26, conductive material disposed over the through-vias structures 1301 and over the insulation substrate 100 may form pads 1305. In some cases, the pads 1305 may be part of a conductive feature such as a patch antenna, routing, or another feature. In some embodiments, the conductive material 1303 may have a thickness between about 3 µm and about 50 µm, such as about 10 µm. In some embodiments, a pitch L1 between adjacent through-via structures 1301 may be between about 400 µm and about 100 µm, such as about 250 µm. In some embodiments, a distance L2 between adjacent pads 1305 may be between about 15 µm and about 50 µm, such as about 30 µm. In some embodiments, a width L3 of a pad 1305 may be between about 200 µm and about 350 µm, such as about 220 µm. In some embodiments, the width L4 of a through-via structure 1301 may be between about 150 µm and about 250 µm, such as about 200 µm. The width L4 may correspond to the opening formed in the insulation substrate 100 for the through-via structure 1301.

Returning to FIG. 25, after depositing the conductive material of the patch antennas 110, feedline vias 1308, thermal vias 1306, upper sidewall antennas 1302, and other conductive features, the patterned mask layer (e.g., the photoresist) may be removed using a wet chemical process or a dry process (e.g., an ashing process). Conductive material may then be patterned in a similar manner on the opposite side of the insulation substrate 100 to form conductive features (or remaining portions of through-vias) on the opposite side of the insulation substrate 100. In this manner, the conductive material may form conductive features and through-vias. Connectors 118 are then attached to the conductive material on the bottom surface of the insulation substrate 100, and may be similar to connectors 118 described in FIG. 5 and may be formed in a similar manner. A protective layer 116 similar to protective layer 116 may also be formed, and other steps such a solderability treatment may also be performed as described previously. In this manner, the antenna structure 1300 may be formed, though the antenna structure 1300 may be formed using other processes in other embodiments.

Turning to FIGS. 27-30, a device structure 1400 (see FIG. 30) is formed according to some embodiments. In FIG. 27, a redistribution structure 210 is formed over a carrier substrate 201. The redistribution structure 210 may be formed in a manner similar to that described previously with regard to FIGS. 6A-7. For example, the redistribution structure 210 may be formed from a series of seed layers and plating processes which are used to build up successive layers of redistribution layers and insulating layers.

Turning to FIG. 28, lower sidewall antennas 1402 and conductive pillars 214 are formed over and connected to the redistribution structure 210. The conductive pillars 214 may be similar to those described previously with respect to FIGS. 8A-B, and may be formed in a similar manner. For example, a photoresist may be formed over the redistribution structure 210 and patterned where the lower sidewall antennas 1402 and the conductive pillars 214 are desired to be formed, and a conductive material deposited onto the exposed portions of the redistribution structure 210. Once formed, the photoresist and excess conductive material may be removed. The lower sidewall antennas 1402 are lower portions of sidewall antennas 1510 formed in the antenna package 1500, described below with respect to FIG. 30. The lower sidewall antennas 1402 may be formed from a similar material and in a similar manner as the conductive pillars 214, and may be formed in the same process steps as the conductive pillars 214. In some embodiments, the lower sidewall antennas 1402 may be formed having a height between about 80 µm and about 300 µm. The lower sidewall antennas 1402 may have a rectangular cross-sectional shape, a circular cross-sectional shape, or another shape.

Turning to FIG. 29, a semiconductor device 220 is then connected to the redistribution structure 210. The semiconductor device 220 may be one or more semiconductor devices 220 similar to those described previously with respect to FIGS. 9A-B, and may be connected to the redistribution structure 210 in a similar manner. The semiconductor device 220 may have a height above the redistribution structure 210 that is lower than, about the same, or higher than a height of the lower sidewall antennas 1402 or conductive pillars 214. In this manner, the device structure 1400 may be formed, though the device structure 1400 may be formed using other processes in other embodiments.

Turning to FIG. 30, an antenna package 1500 is formed by bonding the antenna structure 1300 to the device structure 1400, and a molding material 302 is formed between the antenna structure 1300 and the device structure 1400. The antenna structure 1300 may be bonded to the device structure 1400 in a manner similar to that previously described for FIGS. 10A-C. For example, the connectors 118 of the antenna structure 1300 may be placed on conductive pillars 214 and lower sidewall antennas 1402 of the device structure 1400. A reflow process may be performed. A molding material 302 may then be formed, which may be similar to the molding material 302 described previously for FIGS. 10A-C, and which may be formed in a similar manner.

As shown in FIG. 30, upper sidewall antennas 1302 are bonded to corresponding lower sidewall antennas 1402, forming sidewall antennas 1510. The sidewall antennas 1510 extend from the redistribution structure 210 to the top surface of the antenna structure 1300. The overall height of the sidewall antennas 1510 may be between about 300 µm and about 2 mm. In some embodiments, a distance between a sidewall of the antenna package 1500 and a sidewall antenna 1510 may be between about 50 µm and about 200 µm. The sidewall antennas 1510 may be driven directly or parasitically. In some cases, a sidewall antenna 1510 as described herein may have greater efficiency, greater power, or greater bandwidth than an antenna having smaller overall height. In this manner, sidewall antennas having larger overall height may be integrated within an antenna package. The sidewall antennas 1510 may be used in the same antenna package along with other types of antennas (e.g., patch antennas, dipole antennas, end-fire antennas such as those described herein), and thus the operation of the antenna package may be improved by utilizing multiple types of antennas.

Figure 31:
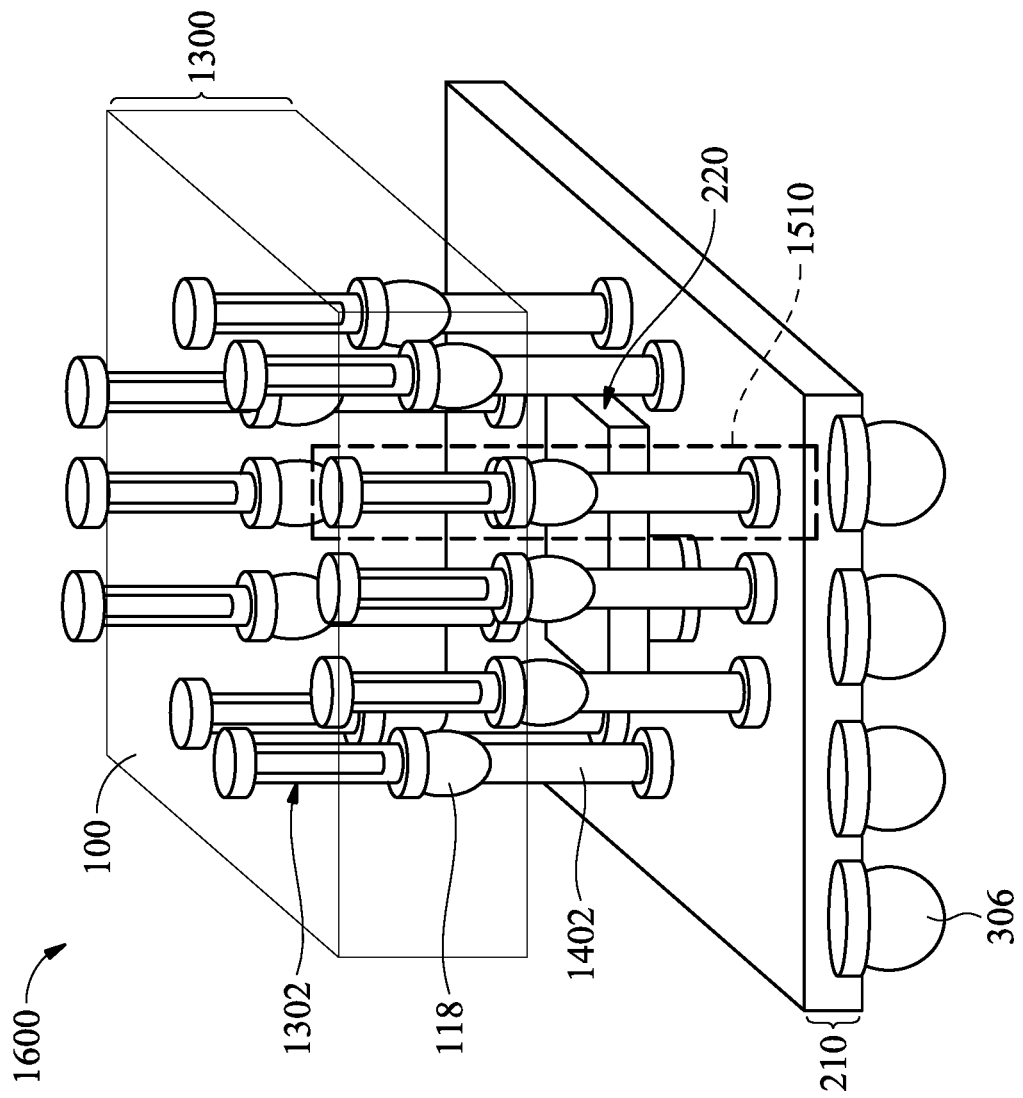
FIG. 31 illustrates a perspective view of an antenna package having sidewall antennas, in accordance with some embodiments.

FIG. 31 shows a perspective view of an antenna package 1600 having sidewall antennas 1510, according to some embodiments. The antenna package 1600 may be similar to the antenna package 1500 described in FIG. 30. Some features of the antenna package 1600 are not shown in FIG. 31 for clarity, such as the molding material 302 or other features such as feedline vias 1308, thermal vias 1306, patch antennas 110, end-fire antennas 112, etc. The sidewall antennas 1510 may be similar to those described above in FIG. 30 and may, for example, include lower sidewall antennas 1402 formed on a redistribution structure 210, and connectors 118 and upper sidewall antennas 1302 formed as part of an antenna structure 1300. As shown in FIG. 31, multiple sidewall antennas 1510 may be formed in an arrangement surrounding the semiconductor device 220. In other embodiments, the multiple sidewall antennas 1510 may be formed in a different arrangement, such as partially surrounding the semiconductor device 220 or another arrangement. Another number of sidewall antennas 1510 may be formed than is shown in FIG. 31. In some embodiments, the sidewall antennas 1510 may be laterally separated by a distance between about 200 µm and about 1 mm. The number and arrangement of sidewall antennas 1510 may be configured to have the antenna characteristics desired for the antenna package 1600. In some embodiments, some sidewall antennas 1510 may be used for output operation and other sidewall antennas 1510 may be used for input operation. Other antennas such as patch antennas 110 or end-fire antennas 112 may also by formed in the antenna structure 1600, and may be used for additional input and/or output operation. In this manner, the antenna package 1600 may operate as a Multiple-In Multiple-Out (MIMO) device.

Figure 32A:
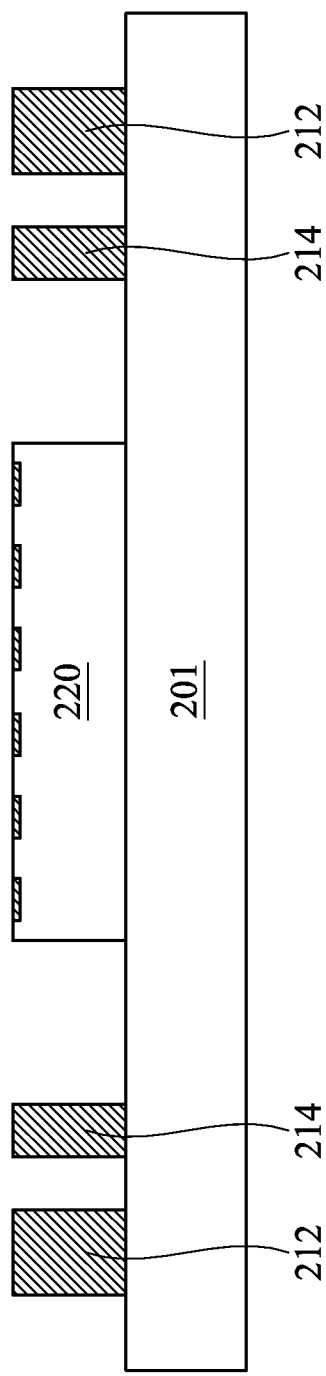
FIGS. 32A through 32C illustrate cross-sectional views of intermediate steps of forming an antenna package, in accordance with some embodiments.
Figure 32B:
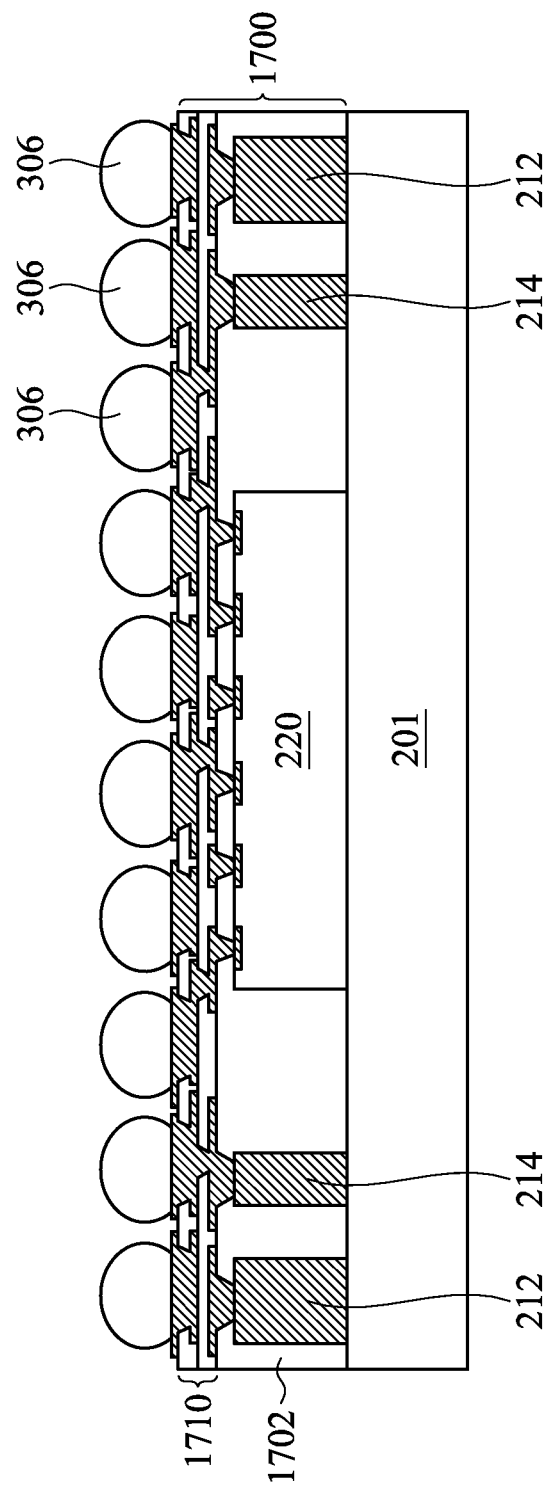
Figure 32C:
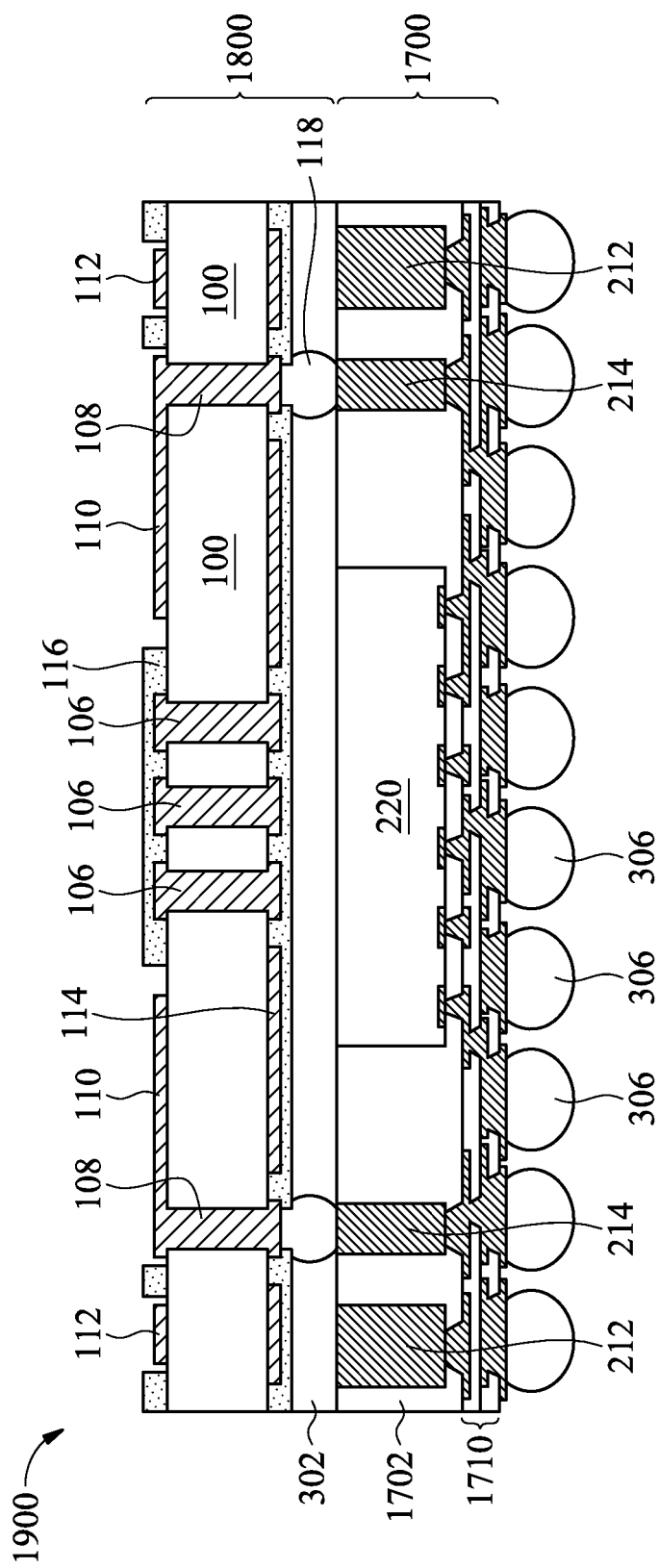

FIGS. 32A-C illustrate intermediate steps of forming an antenna package 1900 (see FIG. 32C), in accordance with some embodiments. In some embodiments, the antenna package 1900 shown in FIG. 32C may be an Integrated Fan-Out (InFO) structure.

In FIG. 32A, dipole antennas 212 and conductive pillars 214 are formed over a carrier substrate 201, and a semiconductor device 220 is placed on the carrier substrate 201. In some embodiments, a release layer (not shown) may be formed on the carrier substrate 201. The dipole antennas 212 and conductive pillars 214 may be similar to those described previously with respect to FIGS. 8A-B, and may be formed in a similar manner. For example, a photoresist may be formed over the carrier substrate 201 and patterned where the dipole antennas 212 and the conductive pillars 214 are desired to be formed. In some embodiments, a seed layer (not shown) may first be formed, and the photoresist formed over the seed layer. A conductive material is then deposited onto the exposed portions of the carrier substrate 201 or onto the exposed portions of the seed layer (if present). Once formed, the photoresist, excess conductive material, and excess portions of the seed layer (if present) may be removed. The semiconductor device 220 may be placed using e.g., a pick-and-place process or another suitable process.

In FIG. 32B, an encapsulant 1702 is formed around the dipole antennas 212, conductive pillars 214 and semiconductor device 220. A planarization process (e.g., a CMP process) may be performed after forming the encapsulant 1702. The encapsulant 1702 may be a material similar to the molding material 302 described previously with respect to FIGS. 10A-C, or may be a resin, polyimide, PPS, PEEK, PES, another material, combinations of these, or the like. A redistribution structure 1710 is formed over the dipole antennas 212, conductive pillars 214, semiconductor device 220, and encapsulant 1702. The redistribution structure 1710 may be formed in a manner similar to that described previously with regard to FIGS. 6A-7. For example, the redistribution structure 1710 may be formed from a series of seed layers and plating processes which are used to build up successive layers of redistribution layers and insulating layers. The redistribution structure 1710 may be electrically connected to the dipole antennas 212, conductive pillars 214, and the semiconductor device 220. External connections 306 may then be formed or placed in electrical connection with the redistribution structure 1710, forming a device structure 1700. The external connections 306 may be similar to the external connections 306 described previously with respect to FIG. 11.

Turning to FIG. 32C, an antenna package 1900 is formed by bonding an antenna structure 1800 to the device structure 1700. The antenna structure 1800 may be similar to antenna structures described previously, such as antenna structure 120 (see FIG. 5), antenna structure 400 (see FIG. 12), antenna structure 700 (see FIG. 17), antenna structure 1000 (see FIG. 22), or antenna structure 1300 (see FIG. 25), though the antenna structure 1800 may be different from these in some embodiments. The carrier substrate 201 is first debonded from the device structure 1700. The antenna structure 1800 may be bonded to the device structure 1700 in a manner similar to that previously described for FIGS. 10A-C. For example, the connectors 118 of the antenna structure 1800 may be placed on the conductive pillars 214 of the device structure 1700, and then a reflow process may be performed. A molding material 302 may then be formed between the antenna structure 1800 and the device structure 1700, which may be similar to the molding material 302 described previously for FIGS. 10A-C. In this manner, an antenna package 1900 may be formed having multiple types of antennas (e.g., dipole antennas 212, patch antennas 110, and end-fire antennas 112) and having thermal vias 106.

By utilizing the embodiments described herein, the performance of a device including antennas ("an antenna package") may be improved and the size of the device may be decreased. Different features of embodiments described herein may be combined to achieve these and other benefits. In some cases, the use of multiple types of antennas in a single antenna package as described herein may allow for improved directionality or efficiency of operation. In some cases, the use of a core substrate for forming some antennas and other conductive features may reduce costs of manufacturing an antenna package. As an example, forming more conductive routing in the antenna structure may allow for a smaller redistribution structure within the antenna package, which can reduce cost of manufacture. In some cases, the groundplane of an antenna may be formed on the outside of the antenna structure or on a semiconductor device within the antenna package such that more space for routing or antennas is available within the antenna structure. This can allow for greater design flexibility of antennas or other features. In some cases, the formation of thermal vias as described herein can allow for improved heat dissipation within the antenna package, which can improve performance and reduce the chance of thermal failure.

In an embodiment, a device includes a redistribution structure, a first semiconductor device, a first antenna, and a first conductive pillar on the redistribution structure that are electrically connected to the redistribution structure, an antenna structure over the first semiconductor device, wherein the antenna structure includes a second antenna that is different from the first antenna, wherein the antenna structure includes an external connection bonded to the first conductive pillar, and a molding material extending between the antenna structure and the redistribution structure, the molding material surrounding the first semiconductor device, the first antenna, the external connection, and the first conductive pillar. In an embodiment, the antenna structure further includes a third antenna that is different from the first antenna and that is different from the second antenna. In an embodiment, the first antenna is a dipole antenna. In an embodiment, the second antenna is a patch antenna. In an embodiment, the antenna structure includes an insulation substrate and at least one via extending through the insulation substrate. In an embodiment, the at least one via includes a thermal via disposed over the first semiconductor device. In an embodiment, the first semiconductor device is a radio frequency chip. In an embodiment, the device includes a thermal adhesive on the first semiconductor device, the thermal adhesive extending from the first semiconductor device to the antenna structure. In an embodiment, the antenna structure includes a copper-clad laminate structure.

In an embodiment, a device includes a redistribution structure, an antenna structure disposed over the redistribution structure, the antenna structure including an insulating layer, a patch antenna on a top surface of the insulating layer, an end-fire antenna on a top surface of the insulating layer, a through-via extending through the insulating layer, and a connector electrically connecting the through-via to the redistribution structure, a dipole antenna connected to the redistribution structure and interposed between the redistribution structure and the antenna structure, and a first semiconductor device connected to the redistribution structure and disposed between the redistribution structure and the antenna structure. In an embodiment, the through-via is connected to the patch antenna. In an embodiment, the through-via is a thermal via. In an embodiment, the device includes a groundplane disposed on the bottom surface of the insulating layer. In an embodiment, the device includes a molding material extending over and surrounding the dipole antenna and the first semiconductor device. In an embodiment, the device includes a groundplane disposed on the molding material.

In an embodiment, a method includes forming a redistribution structure over a carrier wafer, forming multiple first antennas and multiple conductive pillars on the redistribution structure, attaching a first semiconductor device to the redistribution structure, forming multiple second antennas on an antenna substrate, forming a multiple external connectors on the antenna substrate, attaching the multiple external connectors to the multiple conductive pillars, wherein the first semiconductor device and the multiple first antennas are disposed between the redistribution structure and the antenna substrate, forming a molding material between the redistribution structure and the antenna substrate, and removing the carrier wafer. In an embodiment, the method includes forming multiple through vias in the antenna substrate. In an embodiment, the multiple first antennas include dipole antennas and the multiple second antennas include patch antennas. In an embodiment, the method includes forming a conductive layer on a surface of the first semiconductor device and attaching at least one of the multiple external connectors to the conductive layer. In an embodiment, the method includes attaching a second semiconductor device to the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a redistribution structure;
   an antenna structure disposed over the redistribution structure, the antenna structure comprising:
   an insulating layer;
   a patch antenna on a top surface of the insulating layer;
   an end-fire antenna on a top surface of the insulating layer;
   thermal vias extending through the insulating layer;
   a first conductive layer on a bottom surface of the insulating layer, the first conductive layer coupled to the thermal vias; and
   a dipole antenna connected to the redistribution structure, wherein the dipole antenna is between the redistribution structure and the antenna structure; and
   a first semiconductor device connected to the redistribution structure, wherein the first semiconductor device is between the redistribution structure and the antenna structure.

2. The device of claim 1, wherein the dipole antenna is encapsulated with a molding material.

3. The device of claim 2, further comprising a second conductive layer on a top surface of the molding material, the second conductive layer being coupled to ground.

4. The device of claim 2, wherein the molding material extends between the first semiconductor device and the antenna structure.

5. The device of claim 4, further comprising a ground plane extending between the first semiconductor device and the antenna structure.

6. The device of claim 5, further comprising a through via extending through the molding material, wherein the ground plane is connected to the through via.

7. The device of claim 4, wherein the molding material completely separates the ground plane from an upper surface of the first semiconductor device.

8. A device comprising:
   a device structure comprising:
   a redistribution structure;
   a first semiconductor device on the redistribution structure;
   a first conductive layer over a backside of the first semiconductor device;
   a first antenna on the redistribution structure; and
   a first conductive pillar on the redistribution structure, the first conductive pillar being electrically coupled to a conductive feature of the redistribution structure;
   an antenna structure over the device structure, wherein the antenna structure comprises a second antenna that is different from the first antenna, wherein the second antenna is electrically coupled to the first conductive pillar, wherein the first semiconductor device is between the antenna structure and the redistribution structure; and
   a molding material extending between the antenna structure and the redistribution structure.

9. The device of claim 8, wherein the antenna structure further comprises:
   an insulating layer; and
   thermal vias extending through the insulating layer, wherein the thermal vias are not an active part of electrical circuitry.

10. The device of claim 9, wherein the antenna structure further comprises:
    a first conductive layer on a bottom surface of the thermal vias, the first conductive layer being coupled to the thermal vias.

11. The device of claim 9, wherein the thermal vias have a dielectric middle region.

12. The device of claim 9, wherein the thermal vias are positioned directly over the first semiconductor device.

13. The device of claim 8, wherein the first antenna extends completely through the molding material.

14. The device of claim 10, wherein the antenna structure is electrically coupled to the first conductive pillar using a solder joint.

15. A device comprising:
    a device structure comprising:
    a redistribution structure;
    a first semiconductor device on the redistribution structure; a first antenna on the redistribution structure;
    a first conductive pillar and a second conductive pillar on the redistribution structure;
    a molding material on the redistribution structure and extending along sidewalls of the first conductive pillar, the second conductive pillar, the first antenna, and the first semiconductor device; and
    a first conductive layer on the molding material, the first conductive layer electrically coupled to the first conductive pillar, wherein the first conductive layer is a ground plane; and an antenna structure bonded to the device structure, wherein the antenna structure comprises a second antenna, wherein the second antenna is electrically coupled to the second conductive pillar, wherein the first semiconductor device is between the antenna structure and the redistribution structure.

16. The device of claim 15, wherein the antenna structure further comprises
an insulation substrate; and
thermal vias extending through the insulation substrate.

17. The device of claim 16, wherein the antenna structure further comprises
a second conductive layer coupled to the thermal vias.

18. The device of claim 15, wherein the device structure is coupled to the antenna structure using solder connections.

19. The device of claim 15, wherein the molding material extends over the first semiconductor device.

20. The device of claim 19, wherein the first antenna extends completely through the molding material.

* * * * *